United States Patent [19]
Hsu et al.

[11] Patent Number: 5,859,437
[45] Date of Patent: Jan. 12, 1999

[54] INTELLIGENT SUPERVISION SYSTEM WITH EXPERT SYSTEM FOR ION IMPLANTATION PROCESS

[75] Inventors: Pau-Lo Hsu, Hsinchu; Li-Cheng Shen, Taichung; Chin-Shien Yang; Chi-Shun Hou, both of Hsinchu, all of Taiwan

[73] Assignee: Taiwan Semiconductor Manufacturing Corporation, Hsinchu, Taiwan

[21] Appl. No.: 820,453

[22] Filed: Mar. 17, 1997

[51] Int. Cl.$^6$ .................................................. H01J 37/304
[52] U.S. Cl. .................. 250/492.21; 250/492.22
[58] Field of Search .................. 250/397, 398, 250/492.21, 492.22

[56] References Cited

U.S. PATENT DOCUMENTS

| | | | |
|---|---|---|---|
| 4,785,188 | 11/1988 | Mori et al. | 250/397 |
| 4,849,641 | 7/1989 | Berkowitz | 250/492.21 |
| 4,951,190 | 8/1990 | Lane et al. | 364/188 |
| 4,967,380 | 10/1990 | Szajnowski | 250/397 |
| 4,980,562 | 12/1990 | Berrian et al. | 250/492.21 |
| 5,198,676 | 3/1993 | Benveniste et al. | 250/397 |
| 5,278,420 | 1/1994 | Sugiyama | 250/397 |
| 5,711,843 | 1/1998 | Jahns | 156/345 |

*Primary Examiner*—Bruce Anderson
*Attorney, Agent, or Firm*—Christensen O'Connor Johnson & Kindness PLLC

[57] ABSTRACT

An intelligent supervision system on the ion beam map during ion implantation process includes an ion implanter for introducing ions into a wafer, a feature extractor for receiving a beam current signal and a display blanking signal from the ion implanter to extract features of the beam current signal; a fuzzification subsystem for justifying confidence level on the features; and an expert system for recognizing symptoms of abnormal scanning and providing an indication thereof to a human operator. The expert system also provides an indication of appropriate corrective action, which an operator then uses to adjust the implantation process. Alternatively, the expert system may be configured to provide control signals directly to the ion implanter to adjust the implantation process without the need for an operator.

18 Claims, 21 Drawing Sheets

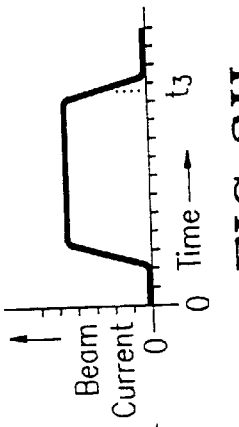
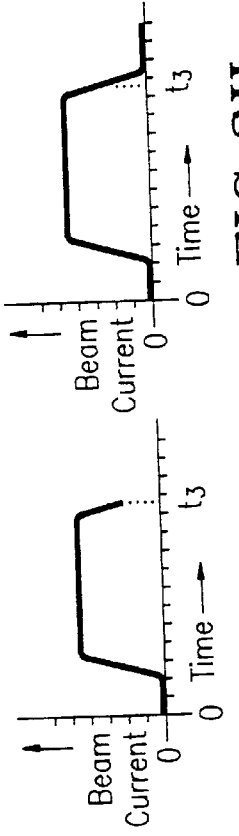
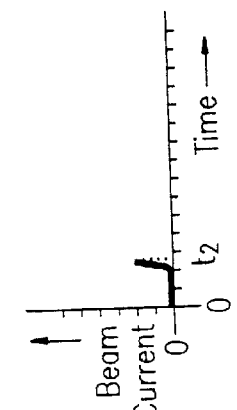
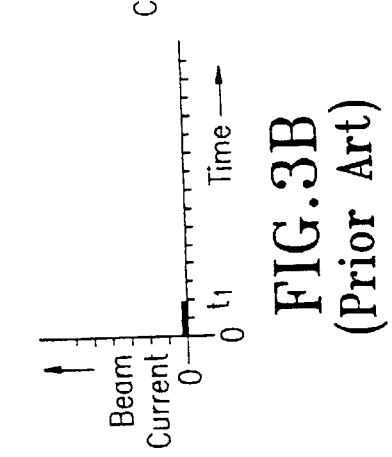
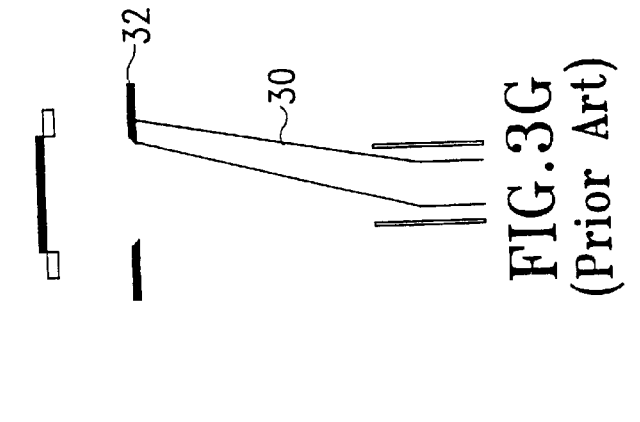
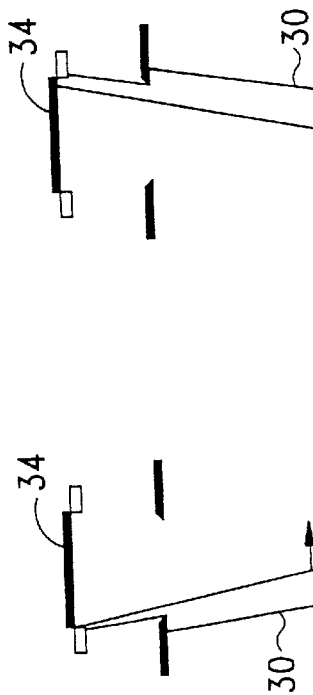
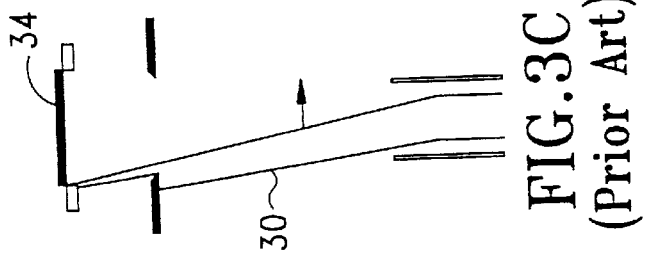
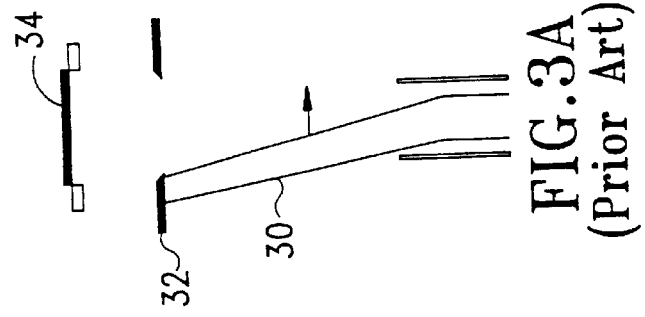

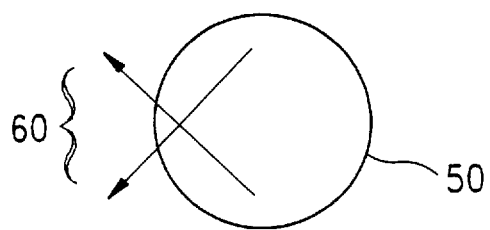
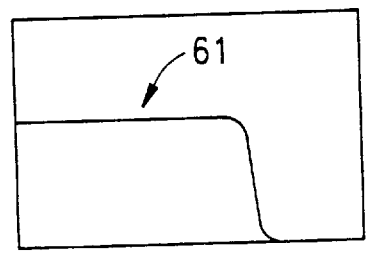
FIG.6A  FIG.6B
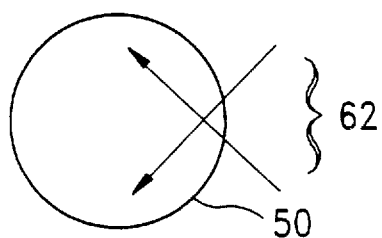
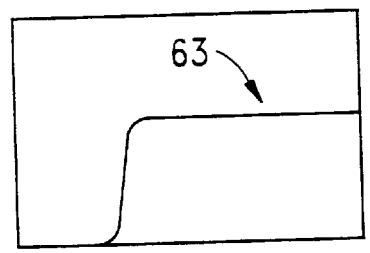
FIG.6C  FIG.6D
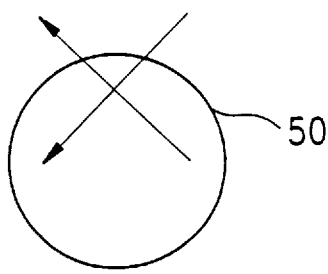
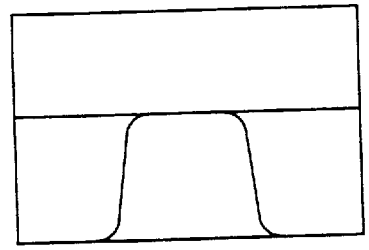
FIG.6E  FIG.6F

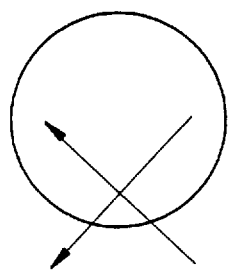 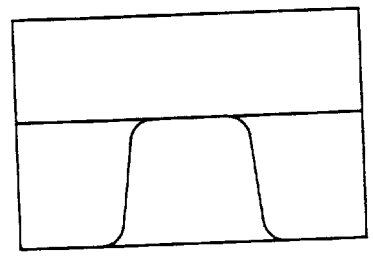
FIG.6G          FIG.6H
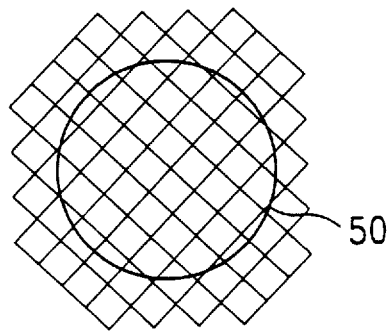 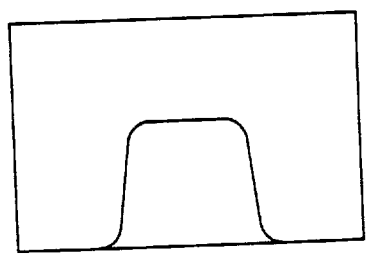
FIG.6I          FIG.6J
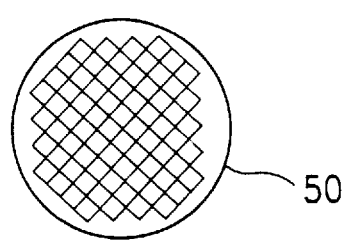 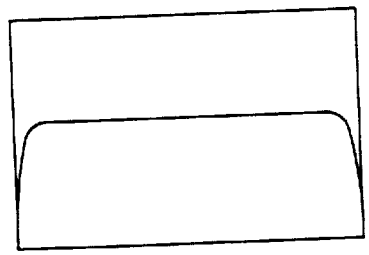
FIG.6K          FIG.6L

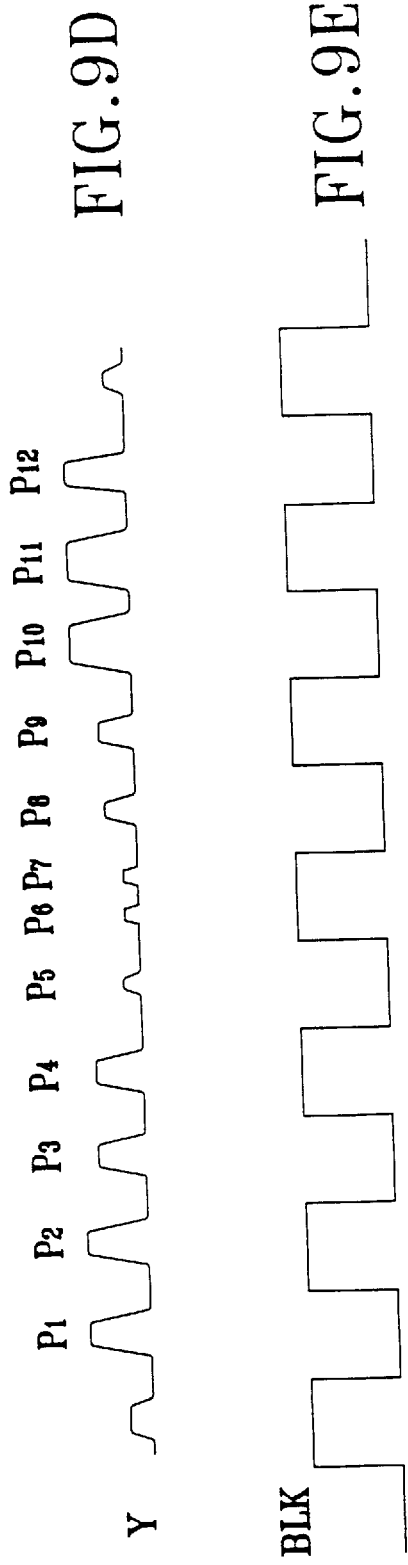
FIG.9D
FIG.9E
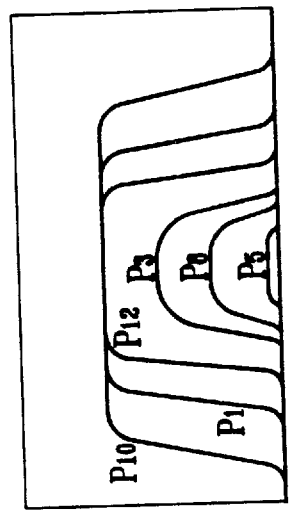
FIG.9F

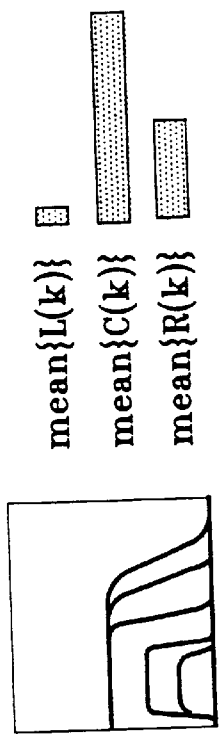
FIG.12B
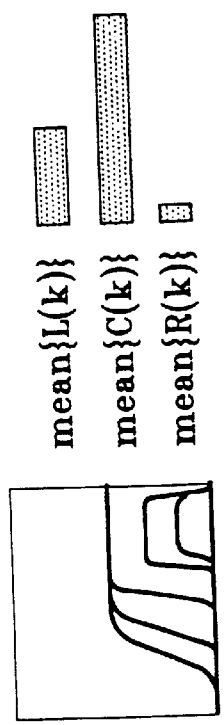
FIG.12A
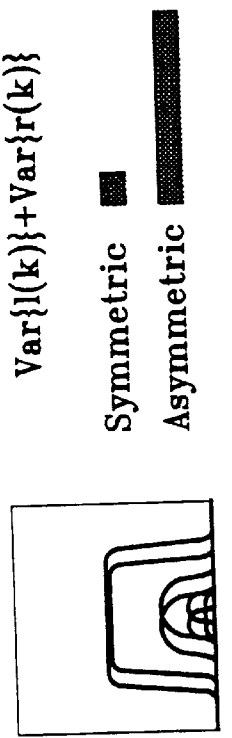
FIG.12D
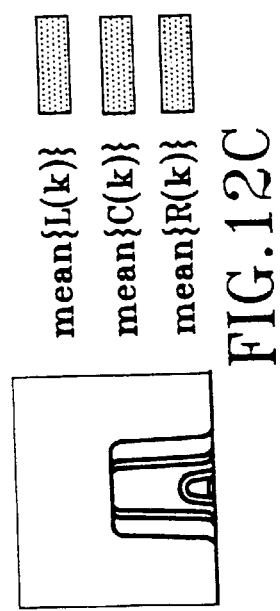
FIG.12C
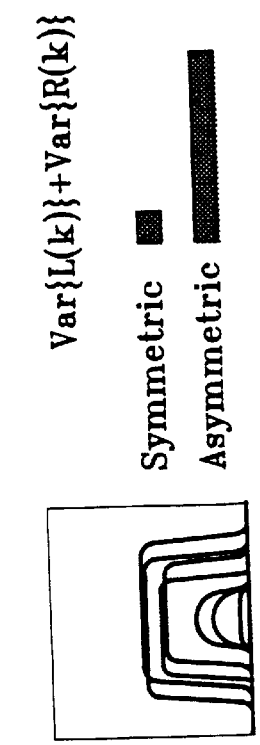
FIG.12F
FIG.12E

INTELLIGENT SUPERVISION SYSTEM WITH EXPERT SYSTEM FOR ION IMPLANTATION PROCESS

CROSS REFERENCE TO RELATED APPLICATION

This invention is related to co-filed U.S. patent application Ser. No. 08/820,461, entitled "Automatic Supervision System on the Ion Beam Map for Ion Implantation Process" filed Mar. 17, 1997, assigned to same assignee as the present application and incorporated herein by reference in its entirety.

BACKGROUND OF THE INVENTION

1. Field of the Invention

The present invention relates to ion implantation systems, and particularly to ion implantation systems with an intelligent supervision system using an expert system during ion implantation.

2. Description of the Prior Art

The electrical properties of a semiconductor crystal can be modified by introducing controlled amounts of dopant impurities into the crystal. Ion implantation and diffusion are the most commonly used methods to introduce impurities into a semiconductor wafer. In silicon semiconductor technology, for example, p-type impurities such as boron or $BF_2$, and n-type impurities such as arsenic, phosphorus, or antimony are typical dopants.

Doping of semiconductor wafers by diffusion is done by introducing impurities into the wafer and redistributing them within the semiconductor crystals at elevated temperature. Unlike diffusion, ion implantation is a low-temperature process in which ionized dopants are accelerated to high energies so that the dopants penetrate to a certain depth when they impact on a target wafer. During the past two decades, ion implantation has become the preferred method of doping semiconductors because of its flexibility in achieving different impurity profiles, and its better control of dopant concentration.

FIG. 1A shows the block diagram of a typical ion implantation machine. The main elements of the machine include an ion source 10, beam transport 12, a target chamber 14 and a man-machine interface 16. The ion source 10 produces a high-density of ions from which the beam transport 12 extracts a focused beam of ions and transports to the target wafer in the target chamber 14.

FIG. 1B shows the schematic of a typical beam transport 12, which includes a mass analyzer 120, an accelerator 124, a focusing system 126, and a scan system 128. The mass analyzer 120 is used to select one of many types of ions from the ion source 10 through the use of a strong magnetic field that separates the ions according to their mass-to-charge ratio. After leaving the mass analyzer 120, the ion beam is accelerated by the accelerator 124 to gain the desired kinetic energy. Next, the accelerated ion beam is focused by the focusing system 126, and then is swept both vertically and horizontally by the scan system 128 across the wafer 140 to distribute the dopants uniformly over the surface of the wafer 140 which is mounted in the target chamber 14. The scan system 128 typically includes X-scan plates 1280 and Y-scan plates 1282.

The man-machine interface 16 (FIG. 1A) is used by an operator to control implantation system parameters, such as recipe, acceleration voltage or ion dosage. This interface 16 can also display other system parameters, such as beam current, on a screen so that the operator can continuously monitor the implantation process. The operator can adjust the implantation process as necessary by controlling, for example, the X-plate and Y-plate voltage by manipulating an adjustment stick, which is commonly referred to as a joystick.

FIG. 2A shows an ion beam map as displayed on the man-machine interface 16 (FIG. 1), which is typically used in supervising an ion implantation process during the fabrication of an integrated circuit. FIGS. 3A to 3H demonstrate the formation of the beam map. Referring to FIG. 3A, ion beam 30 is blocked before time $t_1$ by the beam defining aperture 32, so that the beam current reaching the wafer 34 remains zero as shown in FIG. 3B. Next, as shown in FIG. 3C, the ion beam 30 begins to sweep onto the wafer 34 at time $t_2$. Because part of the ion beam 30 contacts the wafer 34, the beam current rises as shown in FIG. 3D. Referring to FIG. 3E, the entire ion beam 30 sweeps across the wafer 34 between time $t_2$ and $t_3$, resulting a constant maximum beam current as shown in FIG. 3F. Finally, as the ion beam 30 is blocked again by the other end of the beam defining aperture 32 after $t_3$ (FIG. 3G), the beam current decreases as shown in FIG. 3H.

Each time the ion beam sweeps across the wafer, the beam map display generates a different trace. The width of the trace is proportional to the length of the beam path across the wafer. FIGS. 4A to 4D illustrate examples of different traces and the corresponding beam path across the wafer. In FIG. 4A, the ion beam path 40 sweeps through the center of the wafer 41, resulting in a trace 42 having the longest width when displayed on the beam map. This trace 42 is commonly referred to as the outmost edge, and corresponds to the outmost trace 21 shown on the composite beam map in FIG. 2. Referring to FIG. 4B, the beam path 43 across the wafer 41 does not pass through the center of the wafer and, thus, has a shorter length on the wafer 41 than the beam path 40 (FIG. 4A), resulting in a trace 44 as shown in FIG. 4B. As the ion beam scans nearer to the edge of the wafer 41 as in beam path 45, a narrower trace 46 is displayed as shown in FIG. 4C. When the ion beam 47 finally reaches the edge of the wafer 41, the resultant trace 48 has a narrowest width. The traces 44, 46, and 48 described above are commonly referred to as minors, which correspond to the traces under the outmost edge 21 on the composite beam map as shown in FIG. 2A.

The beam map display is conventionally used as part of a supervision system in the ion implantation process to ensure that the implantation process parameters such as recipe, acceleration voltage, and ion dosage are within tolerances and the ions are uniformly implanted on the wafer. In order to keep the implantation process in proper adjustment, the operator needs to continuously observe the beam map display for the occurrence of an abnormal beam map (indicating the implantation process is out of adjustment) and take corrective measures to prevent further damage to the wafer. These corrective measures include adjusting the implantation system parameters; e.g., the X-plate and Y-plate voltage, or even shutting down the implanter. FIG. 2B shows a simplified schematic of a pair of conventional adjustment sticks. These sticks are used to adjust horizontal (X) plate voltage and vertical (Y) plate voltage of the beam scan by an experienced expert or operator. Unfortunately, the analysis of the ion beam display has no standard criterion. This analysis largely depends on the accumulated experience of the operator, which can result in unnecessary or improper adjustment. Further, this manual adjustment by the operator is usually too slow to prevent defective implantation of the wafer, resulting in the failure of the wafer during quality testing. Other approaches may include using a video camera to monitoring the beam map display, using techniques disclosed by Banks in "Signal Processing, Image processing and Pattern Recognition", Prentice Hall, 1990. Complex two-dimensional image processing techniques are used to try to recognize abnormal ion beam maps. However, this approach tends to be impractical due to the complexity of the two-dimensional image processing, which slows down the recognition process so that a relatively large number of faulty implantations occur before abnormal beam scanning is recognized. Thus, a need has arisen for a low cost supervision system that can quickly, automatically and accurately identify symptoms of abnormal ion beam scanning to maintain the quality of the ion implantation process in real time.

SUMMARY OF THE INVENTION

In accordance with the present invention, an intelligent supervision system with a rule-based expert system is provided. In one embodiment, the supervision system includes an ion implanter for introducing ions into a wafer, and a feature extractor for receiving a beam current signal and a display blanking signal from the ion implanter to extract features of the beam map formed from the beam current signal. The beam map includes at least an outmost edge and at least a minor, with the width of the outmost edge being larger than width of the minor. The feature extractor includes a signal converter for extracting features of the outmost edge and the minor from the beam current signal; a data converter for generating means and variances of the extracted features of the outmost edge and the minor; and a data examining device for separating the outmost edge from the minor. In addition, the supervision system includes a fuzzification subsystem for determining a confidence level of the features. Further, an expert system is used for emulating behavior of a human operator in adjustment of the ion beam map. The expert system include an inference engine for providing a model for recognizing the ion beam map, and a rule base for providing a set of rules for setting the ion beam map. Moreover, the present invention includes a display device for display information derived from the expert means, and at least a set of adjustment sticks for controlling the ion implanter based on the information of the display means.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 3A to 3H are diagrams illustrating the formation of an ion beam map;

FIGS. 6A to 6L are diagrams illustrating abnormal scans caused by mis-located scan paths;

FIGS. 9D and 9E illustrate more realistic waveforms of the signal Y and signal BLK;

FIG. 9F illustrates corresponding scan on the beam map for each Y pulse in FIG. 9D;

FIGS. 12A to 12F are diagrams showing beam maps of abnormal ion beam scanning and corresponding histograms of the features generated by the supervision system of FIG. 10A;

DESCRIPTION OF THE PREFERRED EMBODIMENT

Figure 1A:
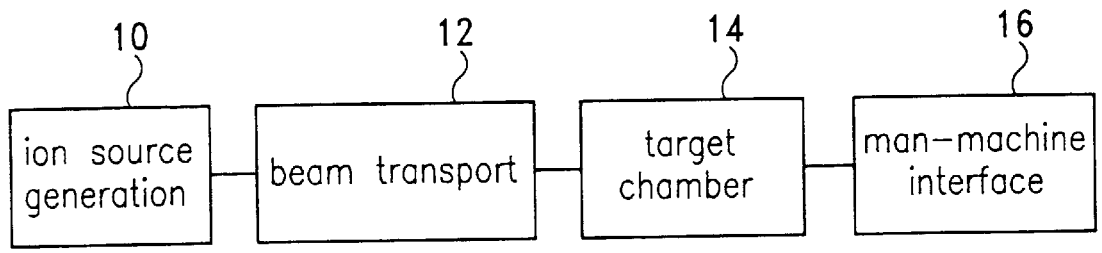
FIG. 1A is a block diagram of a typical ion implantation machine.
Figure 2A:
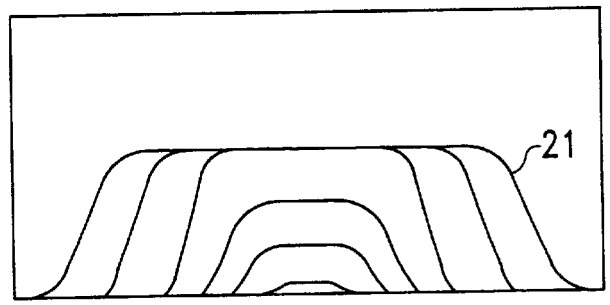
FIG. 2A illustrates a display of an ion beam map from a typical ion implantation machine.
Figure 2B:
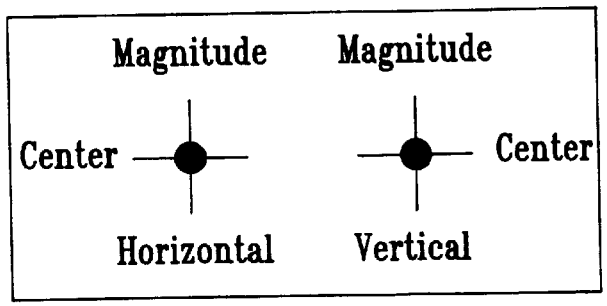
FIG. 2B shows a simplified schematic of a pair of conventional adjustment sticks.
Figure 1B:
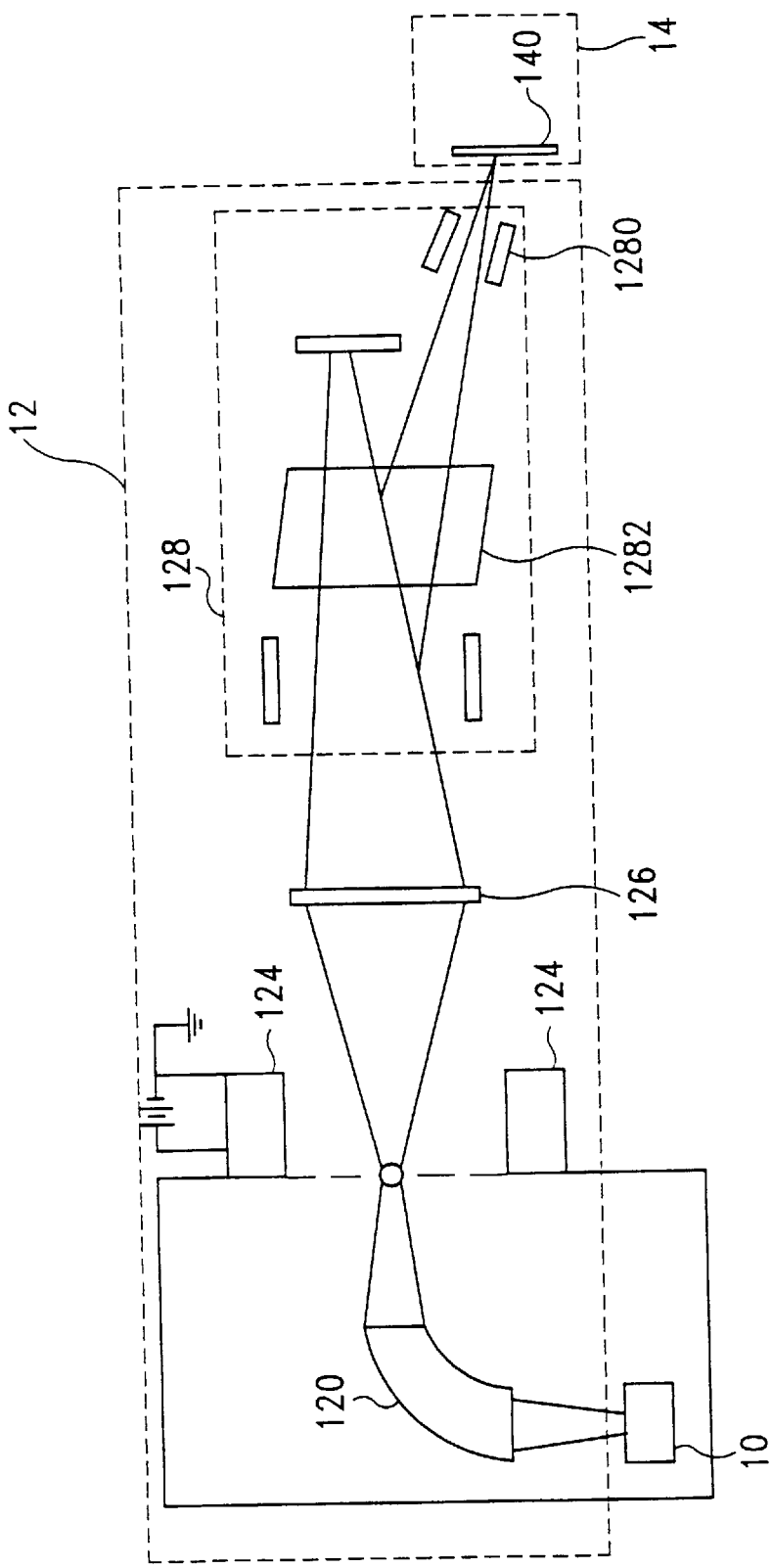
FIG. 1B is a schematic diagram of a beam transport of a typical ion implantation machine.
Figure 4A:
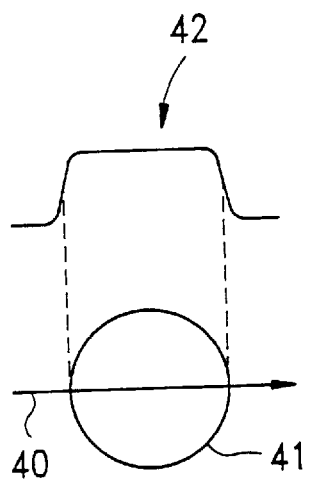
FIGS. 4A to 4D are diagrams illustrating examples of the relationship between a trace of an ion beam map and the scan path of the ion beam across a wafer.
Figure 4B:
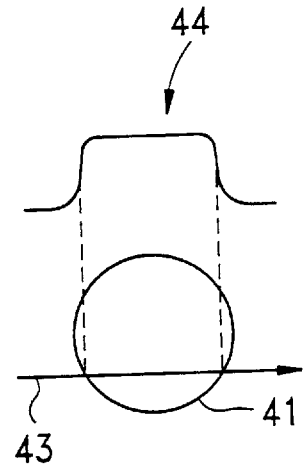
Figure 4C:
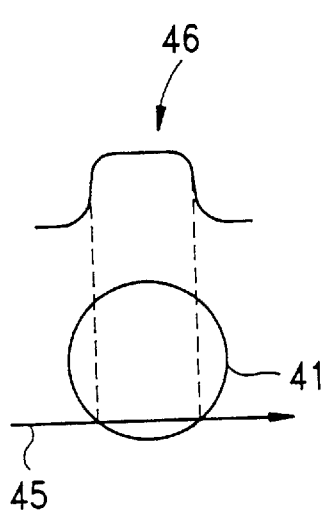
Figure 4D:
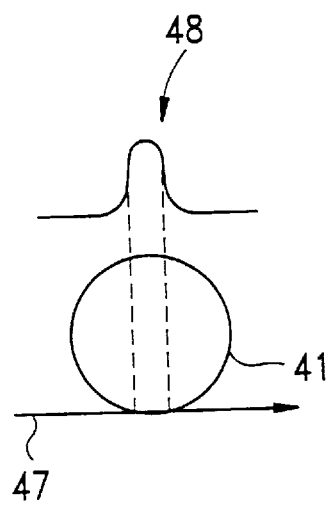
Figure 5:
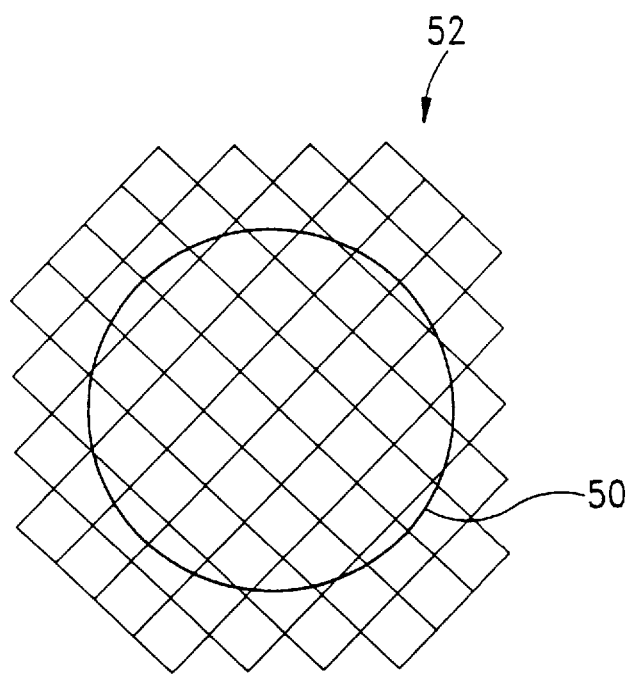
FIG. 5 is a diagram illustrating an ion beam scan pattern on a wafer in an ion implantation process.

FIG. 5 schematically shows a typical scan pattern performed by an ion implantation machine on a wafer 50 during an ion implantation process. In this embodiment, the ion implantation machine is a model NV-6200 A/AV implanter available from Eaton Corporation, Cleveland, Ohio. Other embodiments of the present invention can be adapted to other similarly structured implanters. The scan pattern 52 is achieved by varying of the voltage on the X-Y scan plates (see FIG. 1B) to alter the trajectory of the ion beam, thereby scanning the ion beam across the wafer. In order to uniformly implant ions, the scan pattern 52 is ideally centrally located on the wafer 50. Abnormal scan is commonly classified into two types: the first type of abnormal scan is caused by the un-centrally located scan pattern as shown in FIGS. 6A, 6C, 6E, and 6G. FIGS. 6B, 6D, 6F, and 6H show the corresponding ion beam map corresponding to the misaligned scan patterns depicted in FIGS. 6A, 6C, 6E and 6G, respectively.

Figure 6M:
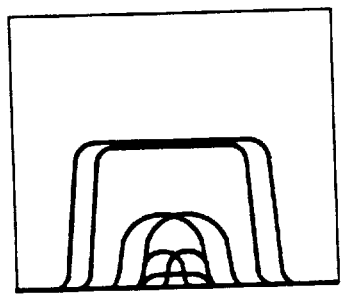
FIG. 6M is a diagram illustrating a Y-magnitude failure.

Referring to FIG. 6A, the scan pattern can be misaligned so that the center of the scan pattern is located to the center and left of the wafer. As shown in FIG. 6A, the center 60 of the scan pattern is located "center left" on the wafer 50, causing the beam map 61 (FIG. 6B) to be shifted to the left. Conversely, when the center 62 of the scan pattern is "center right" as indicated in FIG. 6C, the corresponding beam map 63 (FIG. 6D) is shifted to the right. FIGS. 6E and 6G respectively show a "center high" and a "center low" alignment of the scan pattern, and their resultant beam maps are shown in FIGS. 6F and 6H. There is further a Y-magnitude failure as shown in FIG. 6M, in which the outmost edge is symmetric while the minors are asymmetric.

The second type of abnormal scan is caused not by misalignment of the scan pattern, but by an over-spanned scan path or an under-spanned path. Referring to FIG. 6I and its corresponding beam map shown in FIG. 6J, an over-spanned scan path is illustrated. In an over-spanned scan path, a substantial portion of the scan pattern extends beyond the wafer 50. As a result, a significant portion of the ion implantation process is not directed onto the wafer and, thus, is wasted. Further, a relatively longer time is required to implant the wafer. On the other hand, as shown in FIG. 6K, an under-spanned scan path causes the outer portions the wafer to be uncovered by the scan pattern. Consequently, the outer portions are not implanted. FIG. 6L shows the beam map corresponding to an under-spanned scan path.

Figure 7A:
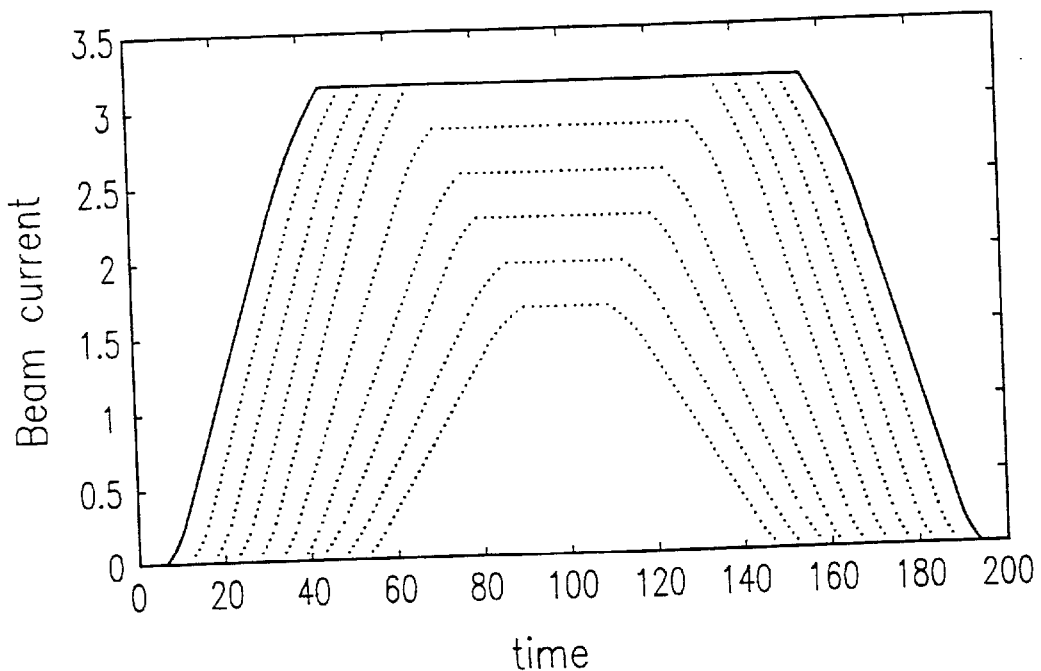
FIGS. 7A to 7F are diagrams showing typical composite ion beam maps.
Figure 7B:
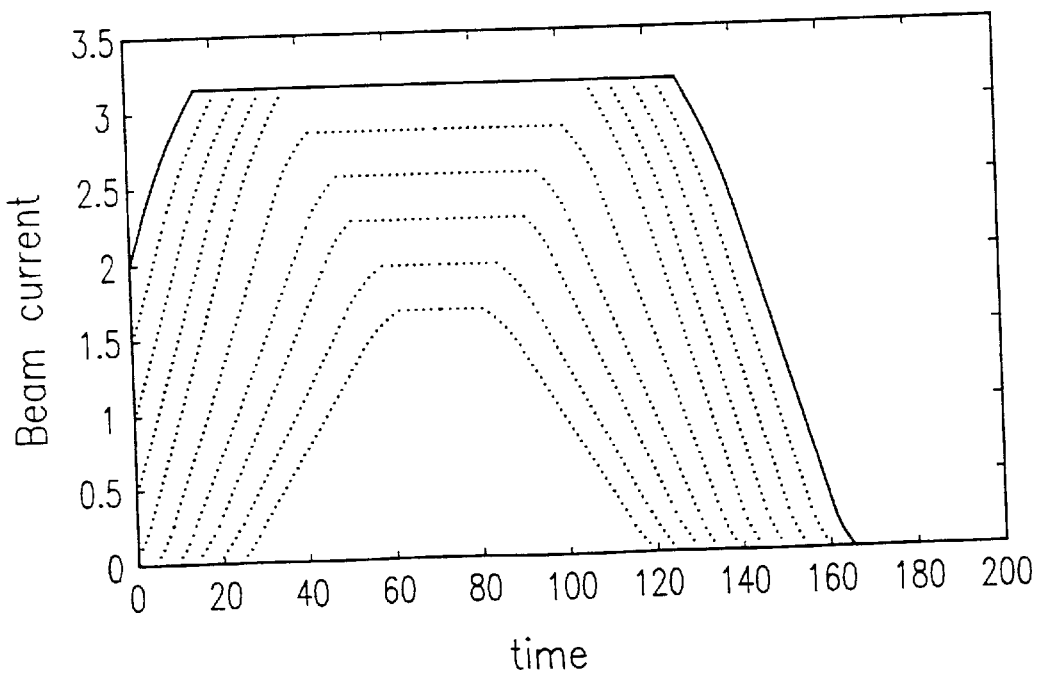
Figure 7C:
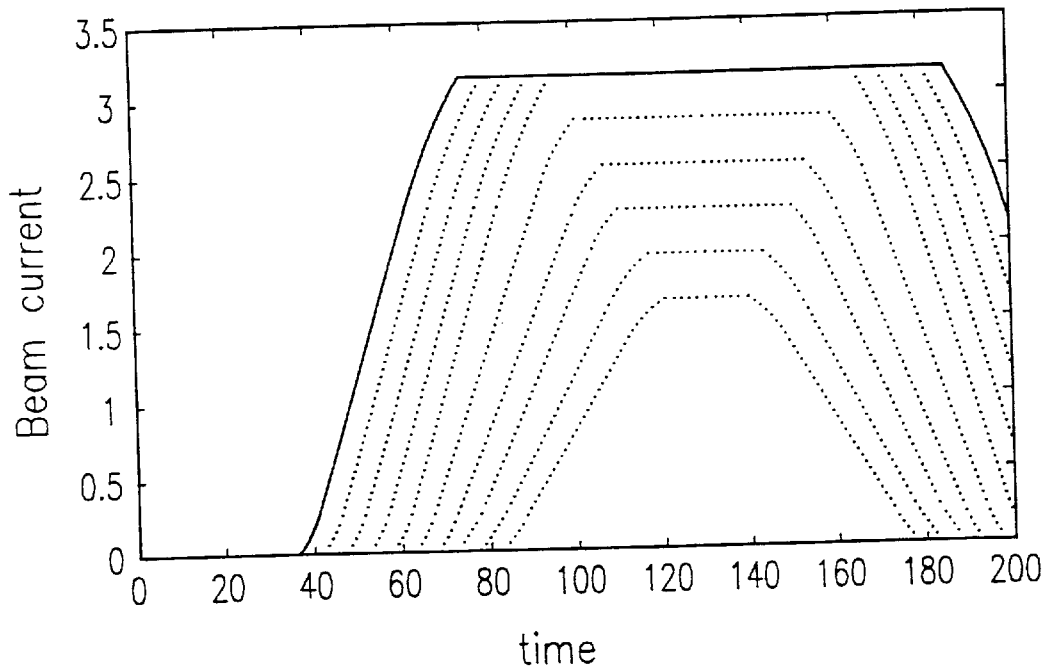
Figure 7D:
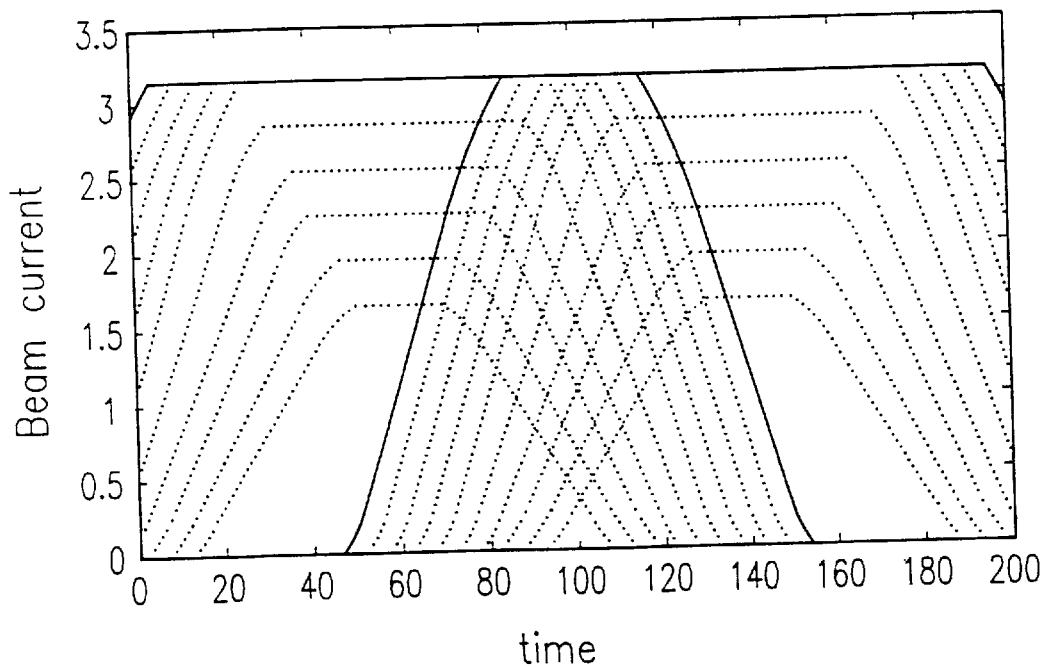
Figure 7E:
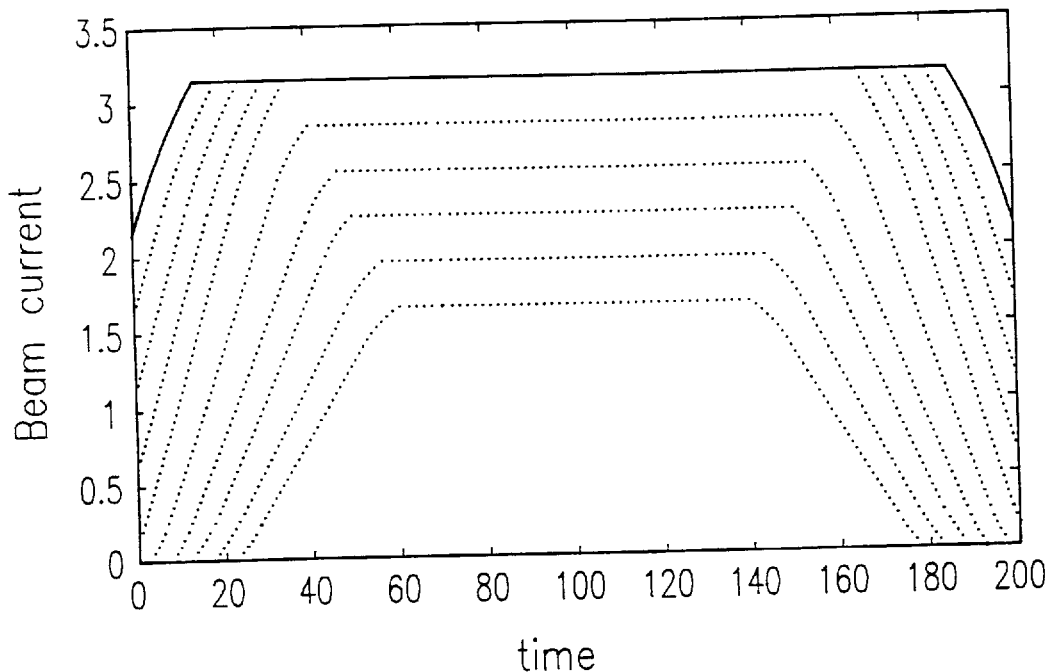
Figure 7F:
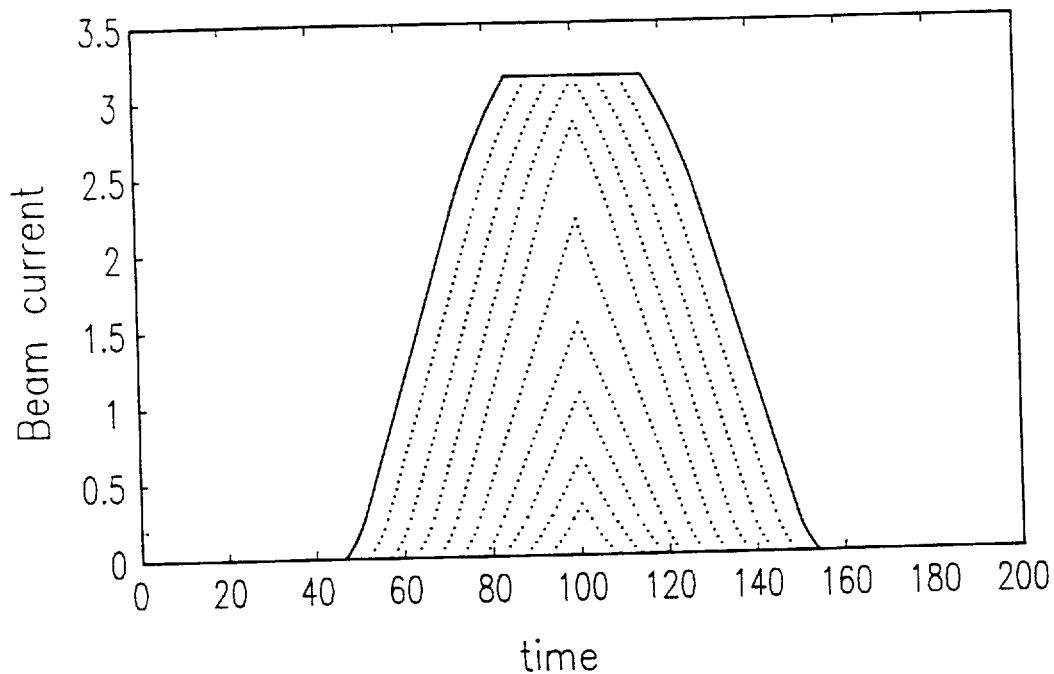

FIGS. 7A to 7F show typical composite beam maps for various scanning situations as generated by a NV-6200 A/AV implanter. FIG. 7A shows an example of a normal scan. FIG. 7B and FIG. 7C respectively show examples of the left-shifted and right-shifted beam maps caused by center-left and center-right abnormal scan patterns. FIG. 7D illustrates an example in which a Y-center failure occurs. FIG. 7E and FIG. 7F respectively show examples of over-spanned and under-spanned scan path beam maps.

Figure 8:
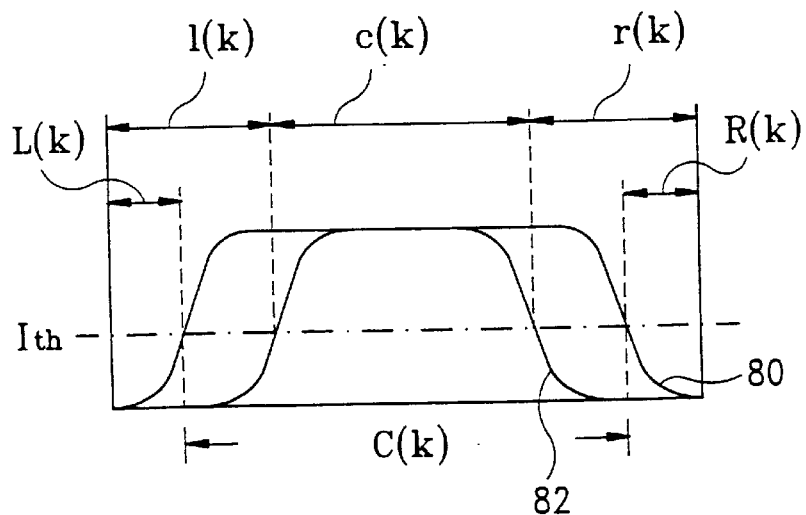
FIG. 8 is a diagram showing a typical beam map from an ion implanter with predetermined features defined thereon.

FIG. 8 shows a typical beam map from an ion implanter, where the outmost edge 80 of the beam map is centered and symmetric with appropriate width, and the minor trace 82 (only one minor is shown for clarity) is under the outmost edge 80 and is symmetric. Using a predetermined threshold beam current $I_{th}$, for each frame of the beam map, the outmost edge 80 is decomposed into a left segment, a center segment and a right segment. The duration of the left, center and right segments of the outmost edge are denoted L(k), C(k), and R(k), respectively, where k represents discrete time. More specifically, the left segment duration L(k) spans from the start of the outmost edge 80 to the point in time at which the beam current equals the predetermined threshold beam current $I_{th}$. The center segment duration C(k) is equivalent to the time that the outmost edge is greater than the predetermined threshold beam current $I_{th}$. The right segment duration R(k) is span of time from the end of the center segment C(k) until the end of the outmost edge 80. In a similar manner, the minor trace 82 is decomposed into a left segment, a center segment and a right segment, with durations l(k), c(k), and r(k), respectively. The left, center and right segment durations of the other minors (not shown) are also determined.

Figure 9A:
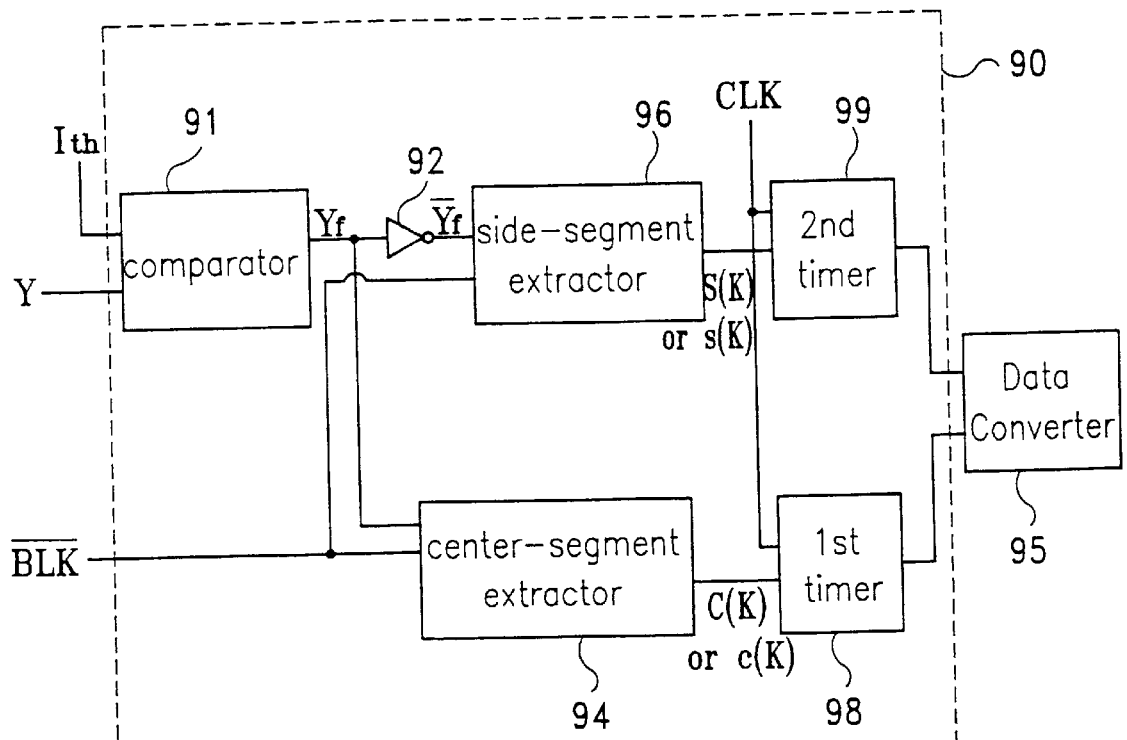
FIG. 9A is a block diagram of a real-time feature extracting circuit according to one embodiment of the present invention.

FIG. 9A shows a block diagram of one embodiment of a real-time automatic supervision system for an ion implanter that includes a feature extractor 90 that is used to extract the features L(k), l(k), C(k), c(k), R(k) and r(k) of the outmost edge and the minors. The feature extracting system includes a comparator 91, which is coupled to receive the beam current signal Y from the implanter and a threshold signal dependent on the predetermined threshold beam current $I_{th}$. The beam current signal Y has a voltage with a magnitude dependent on the magnitude of the beam current. The comparator 91 outputs a feature signal $Y_f$, which, in effect, indicates whether the beam current is above or below the predetermined threshold beam current $I_{th}$. An inverter 92 is connected to receive the feature signal $Y_f$, thereby generating the inverted feature signal $\overline{Y_f}$.

A center-segment extractor 94 is coupled to receive the feature signal $Y_f$ and an inverted display blanking signal $\overline{BLK}$ from the implanter. In this embodiment, the implanter generates the display blanking signal BLK in an active-low signaling format; that is, the beam current signal Y is displayed when the display blanking signal BLK is at a logic low level. From the feature signal $Y_f$ and the inverted blanking signal $\overline{BLK}$, the center-segment extractor 94 generates an output signal having a pulse with a width dependent on the length of the center segment (i.e., either C(k) or c(k)), of the trace of the beam map displayed in the man-machine interface (see FIG. 1A).

In a similar manner, a side-segment extractor 96 extracts the left-and-right-segment characteristic portion of the feature signal $Y_f$ by processing the inverted feature signal $\overline{Y_f}$ and the inverted display blanking signal $\overline{BLK}$. More specifically, because the comparator 91 generates the feature signal $Y_f$ with a logic high level when the beam current is above the predetermined threshold beam current $I_{th}$, the inverted feature signal $\overline{Y_f}$ is at a logic high level when the beam current is below the predetermined threshold beam current $I_{th}$. In this embodiment, the side-segment extractor 96 generates from the inverted feature signal $\overline{Y_f}$ and the inverted display blanking signal $\overline{BLK}$ an output signal having a pair pulses for each trace of the beam map displayed on the man-machine interface. The first pulse of the pair has a width dependent on the length of the left segment (either L(k) or l(k)), whereas the second pulse of the pair has a width dependent on the length of the right segment (either R(k) or r(k)).

The center-segment extractor 94 provides its output signal to a first timer 98, so that the duration of the center segment can be measured. Similarly, the side segment extractor 96 provides its output signal to a second timer 99, so that the duration of the left segment and the right segment can be determined. The durations of the segments L(k), C(k) and R(k) of the outmost edge (or l(k), c(k) and r(k) for a minor) are then provided to the data converter 95. The data converter 95 is implemented in this embodiment with a computing machine, such as a personal computer, for futher processing (described below in conjunction with FIGS. 10–12F). Through the use of the feature extractor 90, the two-dimensional beam map is reduced to one-dimensional signals that numerically represent three features (i.e., the center segment, the left segment, and the right segment) of the outmost edge and the minors of the beam map provided by the ion implanter. These one-dimensional signals can be more quickly and easily analyzed than the two-dimensional beam map, thereby allowing real-time automatic supervision of the implant process.

Figure 9B:
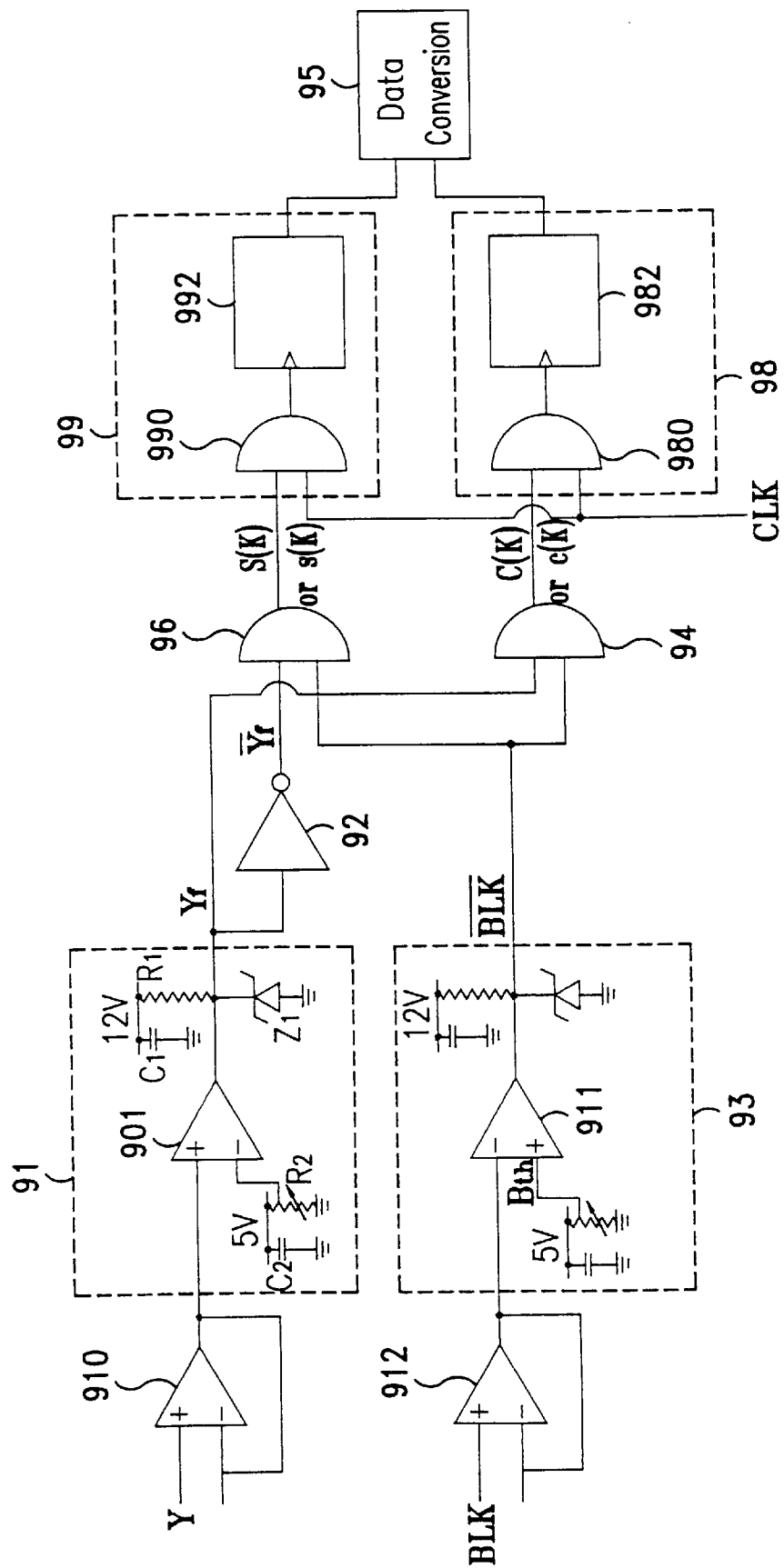
FIG. 9B is a schematic diagram of one implementation of the feature extracting circuit.
Figure 9C:
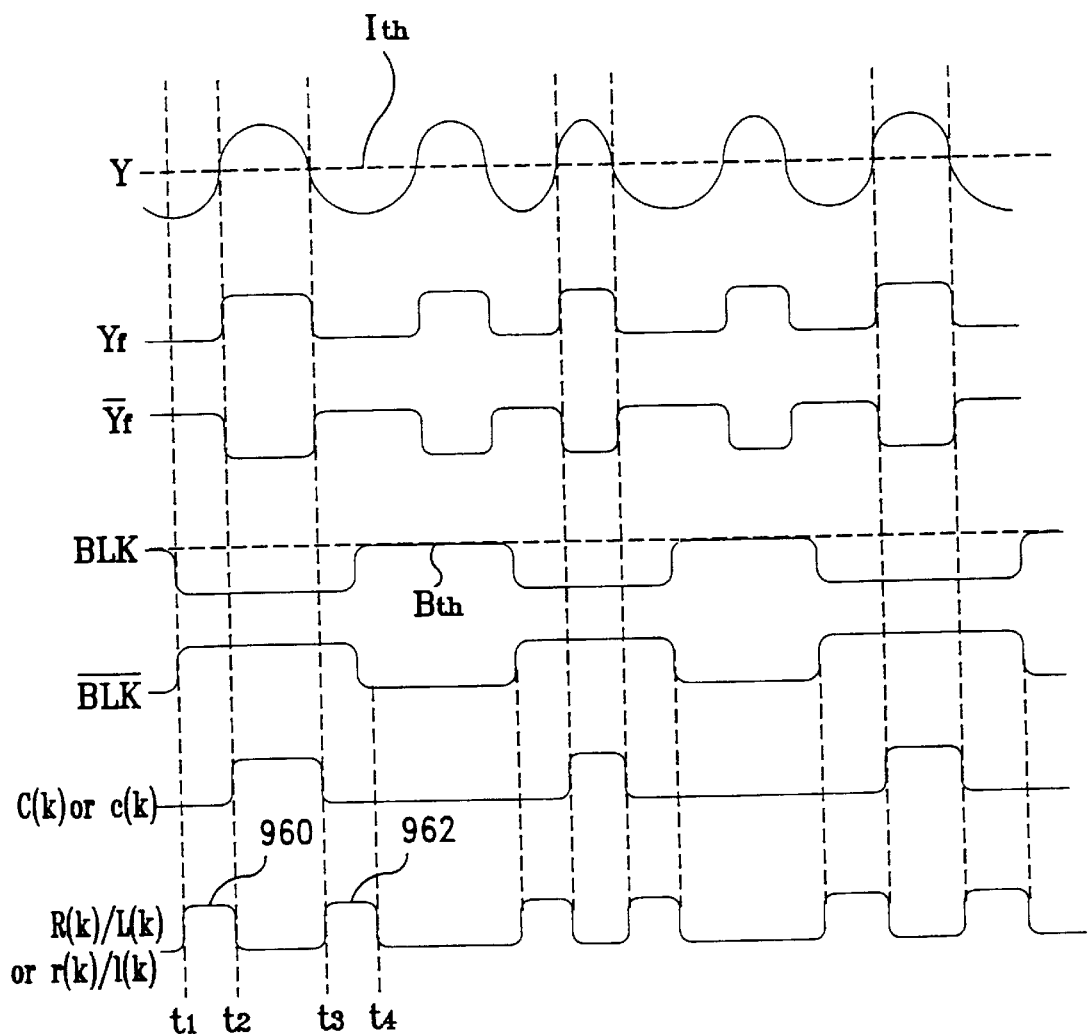
FIG. 9C are timing diagrams illustrating the operation of the feature extraction circuit of FIG. 9B.

FIG. 9B illustrates one embodiment of the implementation of the feature extractor 90 of FIG. 9A. A timing diagram illustrating the operation of this embodiment of the feature extractor 90 is shown in FIG. 9C. The beam current signal Y is provided by the implanter as an analog signal. FIG. 9C shows an example of the beam current signal Y as provided by the implanter. The beam current signal Y is buffered by a unitary gain buffer circuit 910. In this embodiment, the buffer circuit 910 is implemented by connecting the non-inverting input terminal of a conventional operational amplifier (e.g., a standard "741" op-amp) to receive the beam current signal Y and the output lead of the operational amplifier to the inverting input terminal, thereby forming a voltage follower.

The output lead of the buffer circuit 910 is connected to the non-inverting input lead of the comparator 91. In this embodiment, this comparator 91 is implemented using a conventional model 311 operational amplifier 901. A zener diode Z1 having a breakdown voltage of about 5.3 volts is connected between the output lead of the operational amplifier 901 and ground to form a clamp that limits the output voltage of the operational amplifier 901 to a value between 5.3 volts and the ground potential. In addition, a resistor R1 is connected between the output lead of the operational amplifier 901 and a twelve volt voltage source, thereby serving as a pull-up resistor to ensure that the comparator 91 will provide a logic high output voltage of about 5.3 volts. A capacitor C1 is connected between the twelve volt source and ground to help reduce noise.

The inverting input terminal of the comparator 91 is connected to a variable resistor R2. The variable resistor R2 is connected to a five volt voltage source and provides a voltage that is adjustable between zero to five volts to the comparator 91. The variable resistor R2 is adjusted to provide a voltage corresponding to value of the aforementioned predetermined threshold beam current $I_{th}$. A capacitor C2 is connected between the 5 volt source and ground to help reduce noise. The feature signal $Y_f$ is then generated as described above in conjunction with FIG. 9A. The feature signal Yf is at a logic high level when the beam current is above the predetermined threshold $I_{th}$ and a logic low level when the beam current is below the predetermined threshold $I_{th}$, as shown in FIG. 9C. In addition, the inverter 92 is coupled to receive the feature signal $Y_f$, thereby generating the inverted feature signal $\overline{Y_f}$ as shown in FIG. 9C.

In order to provide a digitized inverted display blanking signal $\overline{BLK}$, the display blanking signal BLK from the implanter is firstly buffered by another unitary gain buffer circuit 912, which is substantially similar to the buffer circuit 910. An example of the display buffer signal BLK is shown in FIG. 9C. A comparator 93 is then connected to receive the buffered display blanking signal BLK from the buffer circuit 912. The comparator 93 is implemented with a standard "311" operational amplifier 911. The comparator 93 is structurally similar to the comparator 91, except that the buffered blanking signal BLK is fed to the inverting input terminal of the operational amplifier 911, and a blanking threshold voltage $B_{th}$ is fed to the non-inverting input terminal. The threshold voltage $B_{th}$ is adjustably provided by a variable resistor as described for the voltage corresponding to $I_{th}$ in the comparator 91. The purpose of the threshold voltage $B_{th}$ is to invert the signal BLK without unexpected voltage drift which might miss-trigger counters 982 and 992. The inverted blanking signal $\overline{BLK}$ is thereby generated by the comparator 93 as shown in FIG. 9C. More specifically, the inverted blanking signal $\overline{BLK}$ is at a logic high level from the beginning to the end of each frame of the beam map and is at a logic low level between frames.

The aforementioned center-segment extractor 94 of FIG. 9A is implemented with a conventional two-input AND gate. The AND gate 94 is connected to receive the feature signal $Y_f$ and the inverted display blanking signal $\overline{BLK}$. As a result, the AND gate 94 generates a pulse for each frame of the beam map that represents the feature C(k) for an outmost edge or the feature c(k) for a minor. That is, the width of each pulse provided by the AND gate 94 has a duration equal to the duration of the center segment of the outmost edge or a minor of the beam map. The output signal of the AND gate 94 is shown in FIG. 9C.

The side-segment extractor 96 of FIG. 9A is implemented with a two-input AND gate connected to receive the inverted feature signal $\overline{Y_f}$ and the inverted display blanking signal $\overline{BLK}$. As a result, for each frame of the beam map, the AND gate 96 generates two pulses, with the first pulse corresponding to the left segment duration L(k) of an outmost edge (or l(k) of a minor) and the second pulse corresponding to the right segment duration R(k) of the outmost edge (or r(k) of the minor).

Referring to FIG. 9C, during the active span of the inverted blanking signal $\overline{BLK}$ between times $t_1$ and $t_4$, the feature signal Y is logically ANDed with the signal $\overline{BLK}$, resulting in a pulse representing the feature C(k) or c(k), whose active span between time $t_2$ and $t_3$ represents the duration of the center-segment feature of the beam map. In addition, the logical ANDing of the inverted feature signal $\overline{Y_f}$ and the signal $\overline{BLK}$ generates a left-segment pulse 960 between the times $t_1$ and $t_2$ and a right-segment pulse 962 between the times $t_3$ and $t_4$.

Referring back to FIG. 9B, the output signal from the AND gate 94, representing C(k) or c(k), is provided to the first timer 98 to measure the duration (i.e., the difference $t_3-t_2$ in the example shown in FIG. 9C) of the center segment of the outmost edge or the minor. In this embodiment, the timer 98 is implemented with a two-input AND gate 980 having its output lead connected to the clock input lead of a conventional counter 982. The AND gate 980 is connected to receive a clock signal CLK and the output signal of the AND gate 94. Consequently, the clock signal CLK passes through the AND gate 980 between the times $t_2$ and $t_3$, and the number of clock cycles between the times-$t_2$ and $t_3$ are counted-by the counter 982. In this embodiment, the clock signal CLK has a frequency of about 8 MHz, which is generally much greater than the frequency of the blanking signal BLK to allow accurate measurement of the center segment duration. The output signals of the counter 982 digitally represent the total number of the incoming clock cycles of the clock signal CLK between time $t_2$ and $t_3$. Thus, the features of the beam map are quickly extracted using a relatively simple, low cost circuit. The counters 982 and 992 are reset when the signal BLK goes high.

Similarly, the second timer 99 is implemented with a two-input AND gate 990 and a counter 992. The AND gate 990 is connected to receive the output signal of the AND gate 96 and the clock signal CLK. Thus, the pulses representing the left and right segments are received by the AND gate 990. The counter 992 then receives the logic AND of the pulses and the clock signal CLK, which then counts the number of clock cycles in each pulse. Thus, for example, the counter 992 to counts the number of clock cycles in the time period between times $t_2$ and $t_1$ and in the time period $t_4$ and $t_3$ in the timing diagram of FIG. 9C). The counter 992 will not be reset between pulse. The count in the first counter 982 is latched in a buffer when $Y_f$ goes high, i.e., the end of the first pulse. For example, we have $N_1$ counts after the first pulse ends and latch it in a buffer. Then the counter 992 continues to count during the second pulse of S(k), e.g., we have total $N_2$ counts at the end of the second pulse. Therefore, $t_2-t4=N_1$, and $t_4-t_3=N_2-N_1$. Both of the counts from the first counter 982 and the second counter 992 are provided to the data converter 95 for further processing. FIGS. 9D and 9E illustrate more realistic waveforms of the signal Y and signal BLK. The corresponding scan on the beam map for each Y pulse (i.e., $P_1$ to $P_2$) is shown in FIG. 9F designated with the same corresponding character.

Figure 10A:
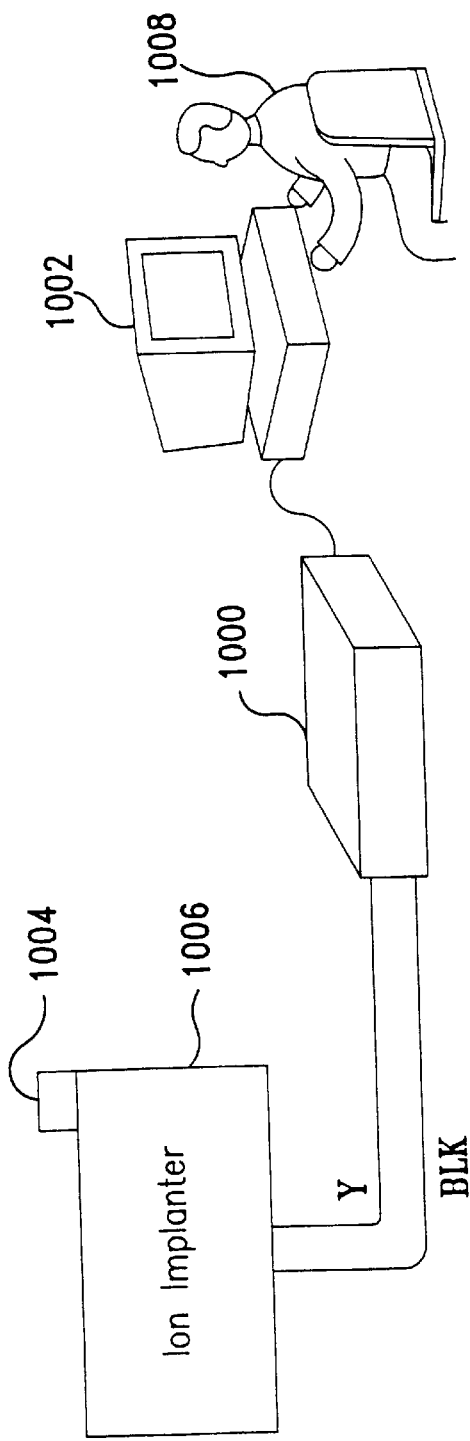
FIG. 10A is a diagram schematically illustrating one embodiment a supervision system according to the present invention.

FIG. 10A schematically shows one embodiment of a supervision system 1000 using the extracted features described above. In this embodiment, the feature extracting system of FIG. 9A, excluding the data converter 95, is embedded in a hardware interface 1001. The data converter 95 is realized by a standard personal computer 1002, which has a DX4-100 microprocessor. Thus, the computer 1002 is widely available at relatively low cost. The computer 1002 receives the durations L(k), l(k), C(k), c(k), R(k) and r(k) for several frames and stores this information in its memory. In one embodiment, the features L(k), l(k), C(k), c(k), R(k) and r(k) for about 300 frames are stored and then analyzed to determine whether an abnormal beam map exists, as described below in conjunction with FIGS. 11A–12F. An alarm 1004 on top of the implanter 1006 is used to alert the operator 1008 in response to an alarm signal (not shown in this figure) generated by the computer 1002 whenever an abnormal situation is detected and recognized. It is appreciated that the alarm 1004 may be located on other place, such as the computer 1002.

In this embodiment, the data converter 95 in FIGS. 9A and 9B is used to process the extracted features and generate several parameters indicative of the adjustment of the beam map. The calculations listed below in Table 1 are performed by the data converter 95. In light of this disclosure, those skilled in the art of supervision systems can program the computer 1002 to calculate these seven parameters without undue experimentation.

TABLE 1

| | |
|---|---|
| parameter 1 | mean of {L (k)} |
| parameter 2 | mean of {C (k)} |
| parameter 3 | mean of {R (k)} |
| parameter 4 | variance of {L (k)} |
| parameter 5 | variance of {l (k)} |
| parameter 6 | variance of {R (k)} |
| parameter 7 | variance of {r (k)} |

Figure 10B:
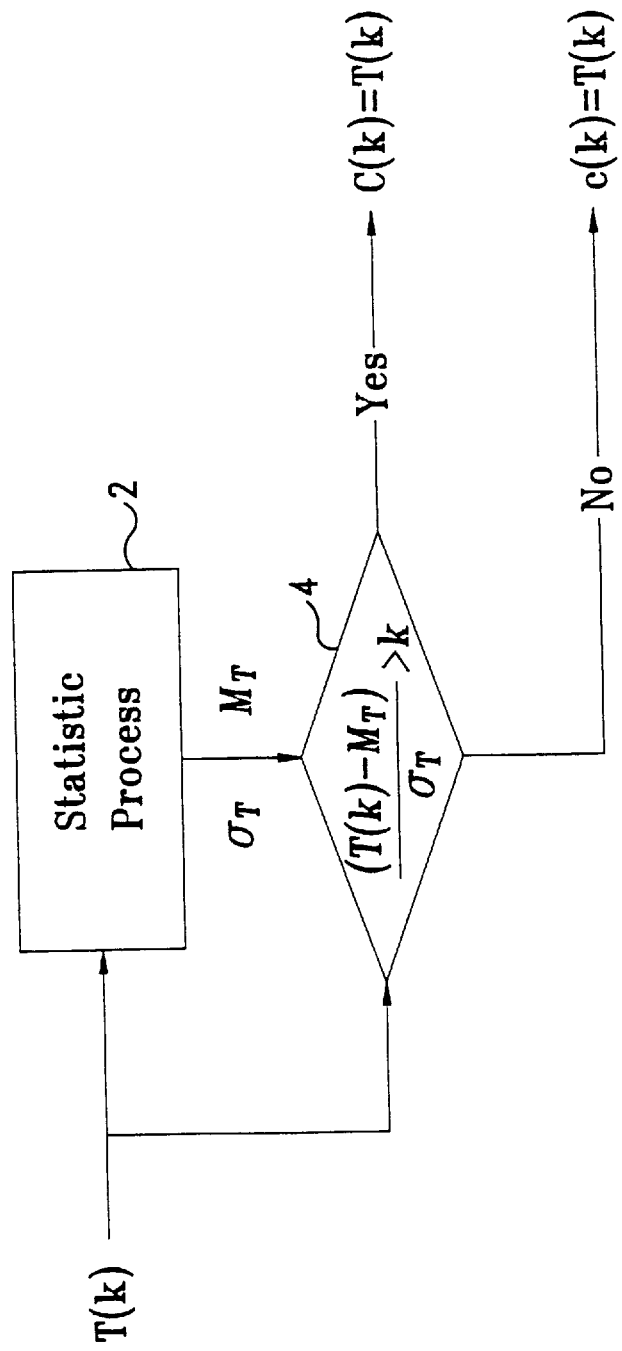
FIG. 10B is a flow diagram illustrating the calculation of $c(k)$ and $C(k)$.

The variance of l(k) and the variance of r(k) are calculated using all of the minors in a beam map. The calculation is done using a conventional method, for example, as shown in FIG. 10B, where T(k) is a sequence consisting of C(k) and c(k), $M_T$ is the mean of T(k), and $\sigma_T$ is the standard deviation of T(k). T(k) is processed by a conventional statistic process 2, and values of $\sigma_T$ and $M_T$ are calculated. After (T(k)-$M_T$)/$\sigma_T$ is compared with k in step 4, C(k) or c(k) is then generated. These parameters are then used to calculate several indexes which are used to recognize abnormal beam maps. These indexes are summarized below in Table 2.

TABLE 2

| | |
|---|---|
| index 1 | mean of C(k) |
| index 2 | mean of {L(k)} − mean of {R(k)} |
| index 3 | variance of {L(k)} + variance of {R(k)} |
| index 4 | variance of {l(k)} + variance of {r(k)} |

The index 1, i.e., the mean of C(k), is a measure of the size of the scan pattern used in the implantation process. If the index 1 is too large, then the beam map shows a symptom of the scan pattern being underscanned. Conversely, if the index 1 is too small, then the beam map shows a symptom of the scan pattern being overscanned. The index 2, i.e., the difference between the mean of {L(k)} and the mean of {R(k)}, is a measure of the horizontal centering of the scan pattern. If the index 2 is too largely positive, then the beam map shows a symptom of the scan pattern being shifted to the right. Conversely, if the index 2 is too largely negative, then the beam map shows a symptom of the scan pattern being shifted to the left. The index 3, i.e., the value of [variance of {L(k)}+variance of {R(k)}], is a measure of the symmetry of the outmost edge. If the index 3 is too large,
then the beam map shows a symptom of the scan pattern being vertically uncentered. The index 4, i.e., [variance of {l(k)}+variance of {r(k)}], is a measure of the symmetry of the minor traces. If the index 4 is too large, then the beam map shows a symptom of the scan pattern having a Y-magnitude failure.

Figure 11B:
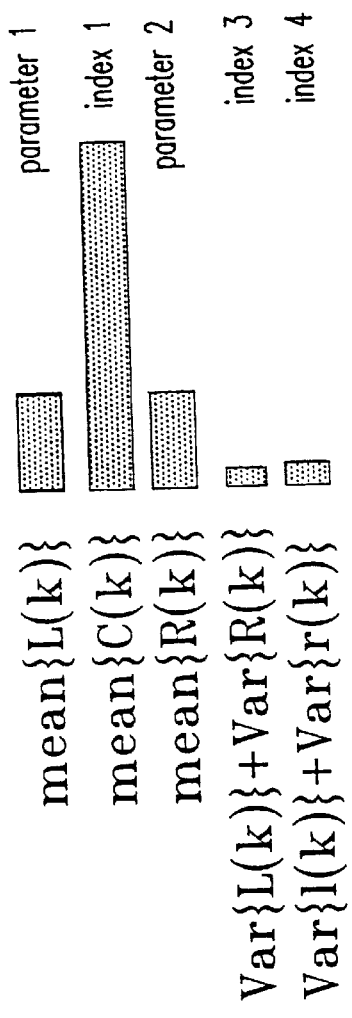
FIG. 11A and 11B are diagrams showing a typical normal beam map and a corresponding histogram of the features generated by the supervision system of FIG. 10A.
Figure 11A:
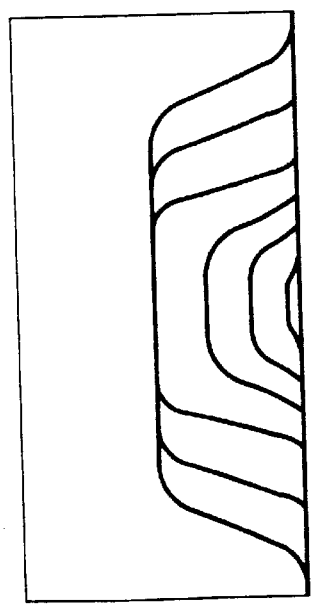

FIG. 11A shows a typical beam map displayed during normal implantation. In FIG. 11B, the indexes 1, 3 and 4 (see Table 2), along with the parameters 1 and 3 (see Table 1) are illustrated by a histogram diagram for the beam map of FIG. 11A. Because the mean {L(k)} and mean {R(k)} are about equal, the index 2 is about zero, thereby indicating that the beam map is horizontally centered. The indexes 3 and 4 are relatively small, indicating that the symmetry of the outmost edges and minors are high.

FIGS. 12A to 12F show beam maps illustrating six symptoms of abnormal ion beam scanning, along with histograms illustrating indexes and parameters corresponding to the ion beam map. In one embodiment of the automatic supervision system 1000 (FIG. 10A), the computer 1002 can be programmed to display these histograms on a display monitor so that the operator 1108 can take corrective actions immediately after being alerted by the alarm 1004.

FIG. 12A shows an abnormal center-right scan, which is indicated by the mean {L(k)} being larger than the mean {R(k)}, i.e., the index 2 (Table 2) is beyond a predetermined positive threshold value. This abnormality is detected by the computer 1002, which sends an alarm signal to the alarm 1004 to inform the operator 1008 of the abnormal beam map. Conversely, FIG. 12B shows an abnormal center-left situation, in which the mean {R(k)} is larger than the mean {L(k)}, i.e., the index 2 (Table 2) beyond the predetermined negative threshold value. In an overscanned implantation, as shown in FIG. 12C, the mean {C(k)}, i.e., the index 1 (Table 2), is less than a predetermined threshold value. On the other hand, FIG. 12D shows an underscanned implantation, in which the mean {C(k)} is larger than a predetermined threshold value. Referring to FIG. 12E, an abnormal situation in which the Y-plate voltage is not centered is illustrated. The computer 1002 recognizes this situation when the value of the index 3 (Table 2), i.e., the variance of {L(k)}+ the variance of {R(k)}, exceeds a predetermined threshold range. In FIG. 12F, a Y-magnitude failure is shown. The Y-magnitude failure is identified when the index 4 (Table 2), i.e., the variance of {l(k)}+the variance of {r(k)}, exceeds a predetermined threshold range. It is appreciated by those skilled in the art, in light of the present disclosure, that other indexes can be defined to identify abnormal beam maps without departing from the spirit of the present invention.

Figure 13:
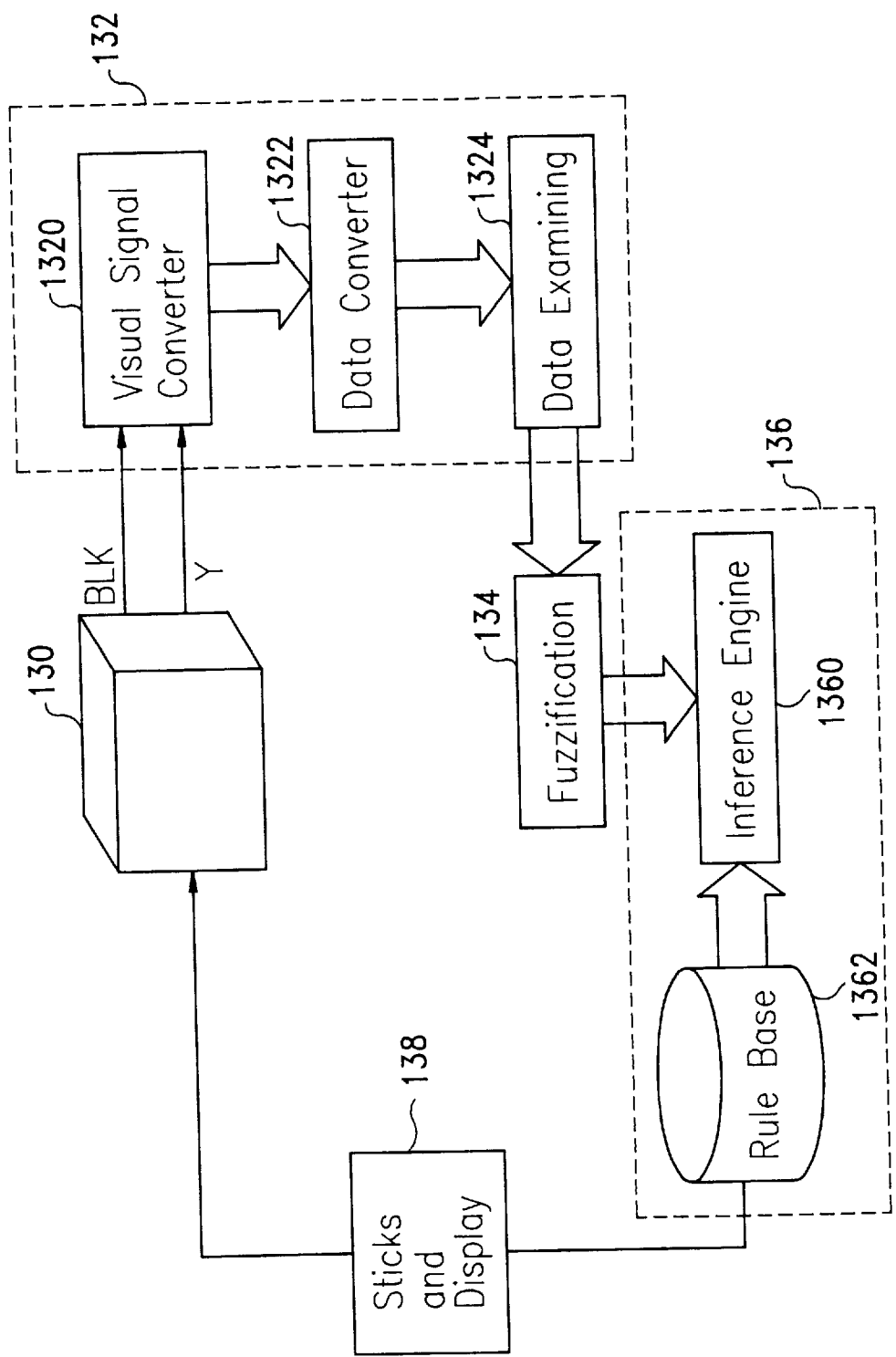
FIG. 13 shows the block diagram of a real-time intelligent beam map supervision system with rule-based expert system according to one embodiment of the present invention.

FIG. 13 shows a block diagram of a real-time intelligent beam map supervision system with rule-based expert system, according to one embodiment of the present invention. This supervision system is configured to provide operators quantitative information for setting up the beam scanning. In this embodiment, the implantation system 130 is a model NV-260 A/AV implanter available from Eaton Corporation, Cleveland, Ohio. The beam current signal Y and the display blanking signal BLK from the implanter 130 are fed to a feature extractor 132. This extractor 132 includes a visual signal converter 1320, which extracts the segment features of the outmost edge and the minors, so that the two-dimensional beam map display is reduced to one-dimensional signal that numerically represent the three features, i.e., the center segment, the left segment, and the right segment, of the outmost edge or the minors of the beam current from the ion implantation system 130. FIG. 9B shows one implementation of the visual signal converter 1320. The feature extractor 132 also includes a data converter 1322, which is preferably implemented in a conventional computer to perform calculations such as mean or variance of the resultant segment features from the visual signal converter 1320. These segment features include the center segment C(k), the left segment L(k), the right segment R(k) of the outmost edge, and the center segment c(k), the left segment l(k), the right segment r(k) of the minors. In this embodiment, calculations listed in Table 3 are performed in this data converter 1322.

TABLE 3

| | |
|---|---|
| $F_1$ | mean of {C (k)} |
| $F_2$ | mean of {L (k)} − mean of {R (k)} |
| $F_3$ | variance of {L (k)} + variance of {R (k)} |
| $F_4$: | variance of {l (k)} + variance of {r (k)} |

$F_1$ represents the average duty (or duty cycle) of ion implantation on a wafer during an ion beam scanning path, $F_2$ indicates the variation of a beam map from the center of the beam monitor, $F_3$ illustrates the symmetry of the outmost edge, and $F_4$ shows the symmetry of the minor curves of the beam map. The duty cycle means the percentage of time in a scan path when the ion beam hits the target wafer.

Moreover, the feature extractor 132 includes a data examining subsystem 1324, which is used to separate the outmost edge from the minor curves from the data converter 1322 by using, for example, a Chebyshev method. The separation performed in the data examining subsystem 1324 is preferably implemented in a program resided in a personal computer. However, the function of this separation can be hard-wired in a printed circuit board or fabricated in an integrated circuit.

Figure 14:
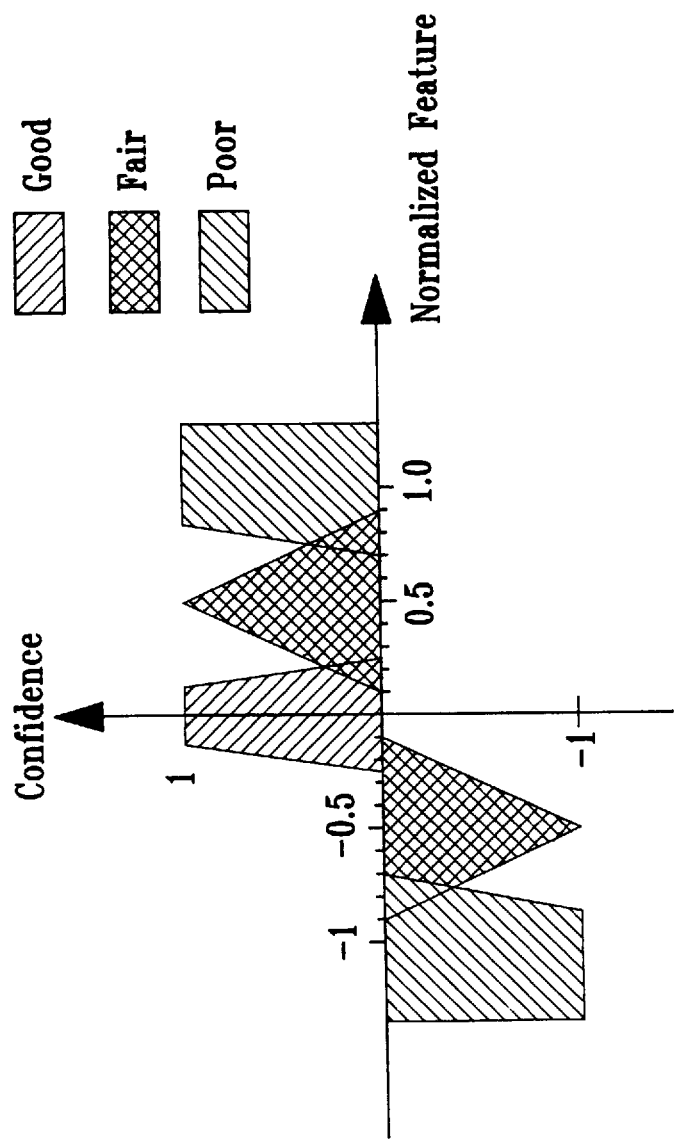
FIG. 14 shows the bidirectional fuzzy rule for implementing fuzzification.

The resultant data from the feature extractor 132 are further processed by a fuzzification subsystem 134 to justify the confidence level for each decision based on a statistical test of the input data. More specifically, the data from the feature extractor 132 is rejected if the statistical test of the data does not meet the predetermined confidence level. In this embodiment, the statistical test or fuzzification is implemented using a conventional bidirectional fuzzy rule as shown in FIG. 14. This fuzzy rule with weighted fuzzy sum is:

$$\text{suitability}_i = \sum_i (\text{weighting}_i)(\text{rating}_i) \qquad (1)$$

The weighted fuzzy rule is common in fuzzy theory, and the variables suitability, weighting and rating, have the physical meaning in themselves.

Referring back to FIG. 13, a rule-based expert system 136 is used in this real-time intelligent beam map supervision system to emulate the behavior of an experienced human expert in a well-bounded domain of knowledge. One of the major components in this expert system 136 is the inference engine 1360, which is the control structure within the expert system 136 to house the search strategies to allow the expert system to arrive at various conclusions. Similar to other rule-based expert systems (commonly referred to as production expert systems), the expert system 136 uses a number of IF-THEN or condition-action rules, which the expert system applies to the data from the fuzzification subsystem meeting the confidence level. One embodiment of the qualitative model for the beam map recognition in the inference engine 1360 is summarized below in Table 4.

TABLE 4

| Function | Result | Condition |
|---|---|---|
| $F_1$ | MEDIUM | The width of the ion beam map is APPROPRIATE |
| | SMALL | The beam map is too NARROW |
| | LARGE | The ion beam map is too WIDE |
| $F_2$ | ZERO | The ion beam map is CENTERED |
| | POSITIVE | The ion beam map is uncentered to RIGHT |
| | NEGATIVE | The ion beam map is uncentered to LEFT |
| $F_3$ | SMALL | The ion beam map is SYMMETRIC |
| | LARGE | The ion beam map is ASYMMETRIC |
| $F_4$ | SMALL | The minors of the ion beam map are SYMMETRIC |
| | LARGE | The minors of the ion beam map ASYMMETRIC |

The boundaries of the small, medium and large values of $F_1$ and the boundaries of the small and large values of $F_3$ are dependent on the implantation machine, the process, or other specific fabrication-related parameters. The boundaries are determined by the expert system.

Another one of the major components in the expert system 136 is the rule base (knowledge base) 1362, which is the set of facts and rules of thumb about the beam map setup. In this embodiment, the rule base characterizes the action to be taken for this particular implanter in response to abnormal scanning. A rule base adapted for the Eaton NV-6200 A/AV implanter, according to one embodiment of the present invention is summarized below in Table 5.

TABLE 5

| Scan Abnormality | Rule |
|---|---|
| underscanning | The Horizontal-Magnitude should be tuned UP |
| overscanning | The Horizontal-Magnitude should be tune DOWN |
| uncentered to LEFT | The Horizontal-Center should be tuned RIGHT |
| uncentered to RIGHT | The Horizontal-Center should be tuned LEFT |
| Y-direction scan range is UNDERSCANNED | The Vertical-Magnitude should be tuned UP |
| Y-direction scan range is OVERSCANNED | The Vertical-Magnitude should be tuned DOWN |
| Y-direction scanning is UNCENTERED | The Vertical-Center should be adjusted |

Figure 15B:
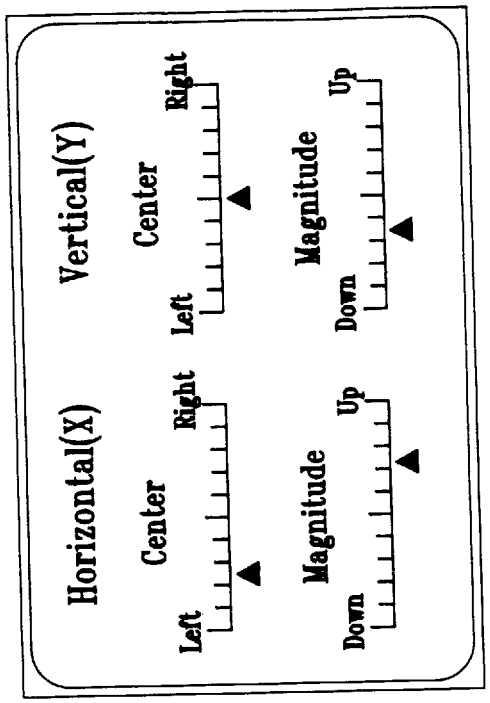
FIG. 15B shows a display on a monitor, where the information displayed on the monitor is derived from the supervision system.
Figure 15A:
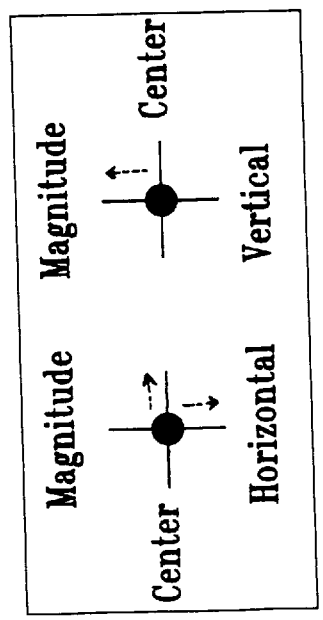
FIG. 15A shows a simplified schematic of a pair of adjustment sticks.

The supervision system is configured to provide the recognized abnormal scan condition and the rule or action to correct the abnormal condition. Accordingly, the human operator can easily and efficiently adjust the ion implantation process to achieve satisfactory quality by manipulating the joysticks 138. More specifically, FIG. 15A shows a simplified schematic of a pair of adjustment joysticks. The joysticks are used to adjust horizontal (X) plate voltage and vertical (Y) plate voltage of the beam scan. Based on the information derived from the supervision system and displayed on the display monitor (FIG. 15B) of a personal computer, the operator can make the adjustment(s) recommended by the supervision system. For the example display shown in FIG. 15B, the operator can easily and efficiently adjust the joysticks in the direction of the dashed arrows. In view of the present disclosure, those skilled in the art of supervision systems can implement other embodiments in which the expert system 136 directly controls the implanter 130 to automatically adjust the beam map in response to recognition of abnormal scanning through the use of a conventional electrical-feedback control method, without manual adjustment using the sticks 138.

Although specific embodiments have been illustrated and described, it will be appreciated by those skilled in the art that various modifications may be made without departing from the spirit and scope of the present invention, which is intended to be limited solely by the appended claims. For example, other embodiments may be adapted for use with implanters other than the Eaton model NV-6200 A/AV implanter. Also, modification of the model in the inference engine 1360 and the rule base 1362 may be made without departing from the spirit of the present invention as claimed.

What is claimed is:

1. An ion implantation system with an automatic supervision system for controlling implantation of ions in a semiconductor wafer, the ion implantation system being configured to generate a beam map during ion implantation, said beam map comprising a plurality of frames each having an outmost edge and one or more minors, said outmost edge and said minors each having a width, wherein the width of said outmost edge is larger than the width of said minor, the ion implantation system comprising:

implantation means for implanting ions in the semiconductor wafer by repeated scanning of a beam of ions across the wafer;

feature extraction means for extracting information from the beam map generated by the ion implantation system, wherein for each frame of said beam map the information extracted by said feature extraction means comprises magnitudes of:

a first left segment spanning from a beginning point of said outmost edge to a first point at which said outmost edge equals a predetermined threshold;

a first center segment spanning from said first point to a second point at which said outmost edge equals the predetermined threshold;

a first right segment spanning from the second point to an ending point of said outmost edge;

a second left segment spanning from a beginning point of a minor to a third point at which said minor equals the predetermined threshold;

a second center segment spanning from the third point to a fourth point at which said minor equals the predetermined threshold; and a second right segment spanning from the fourth point to an ending point of said minor;

fuzzification means for determining a confidence level of the information extracted by said feature extraction means; and expert means for receiving the information from said feature extraction means and the determined confidence level from said fuzzification means and in response thereto recognizing abnormal ion beam scanning and providing adjustment information for adjusting the implantation means to correct the abnormal ion beam scanning.

2. The ion implantation system according to claim 1, further comprising a display coupled to the expert means, wherein the display is configured to display recognition information and said adjustment information derived by said expert means.

3. The ion implantation system according to claim 2, wherein said implantation means further comprises adjustment means for adjusting ion implanting by said implantation means.

4. The ion implantation system according to claim 1, wherein said expert means provides said adjustment information directly to said implantation means to automatically adjust ion implanting by said implantation means.

5. The ion implantation system according to claim 1, wherein said fuzzification means uses a bidirectional fuzzy rule to determine a suitability of the information extracted by the feature extraction means.

6. The ion implantation system according to claim 1, wherein said expert means comprises:

an inference engine coupled to said feature extraction means, said inference engine being configured to provide a model for recognizing symptoms of abnormal scanning; and a rule base coupled to said inference engine, said rule base being configured to provide a set of rules for adjusting said implantation means to correct the abnormal beam scanning.

7. The ion implantation system according to claim 6, wherein the feature extraction means comprises:

a visual signal converter for providing data dependent on features of the beam map received from the implantation means; and a data converter for providing statistical information dependent on the data from the visual signal converter.

8. The ion implantation system according to claim 6, wherein the statistical information received from feature extraction means comprises:

a first value representing an average duty of ion implantation on the wafer during a beam scanning path;

a second value representing variation of the beam map from center of a beam monitor;

a third value representing symmetry of the outmost edge of the beam map; and a fourth value representing symmetry of the minor of the beam map.

9. The ion implantation system according to claim 8, wherein said model of the inference engine comprises:

a width of a beam map, wherein the width of the beam map is appropriate if the first value is larger than a first boundary and less than a second boundary, narrow if the first value is less than the first boundary and wide if the first value is larger than the second boundary;

a centering of the beam map, wherein the beam map is centered if the second value is zero, left-uncentered to left if the second value is negative, and right-uncentered if the second value is positive;

a symmetry of the beam map, wherein the symmetry of the beam map is symmetric if the third value is less than a third boundary, and asymmetric if the third value is larger than the third boundary; and a symmetry of minors of the beam map, wherein the symmetry of minors is symmetric if the fourth value is less than a fourth boundary, and asymmetric if the fourth value is larger than the fourth boundary.

10. The ion implantation system according to claim 9, wherein said set of rules of the rule base comprises:

if the beam map is underscanning, then a horizontal-magnitude should be tuned up;

if the beam map is overscanning, then the horizontal-magnitude should be tuned down;

if the beam map is left-uncentered, then a horizontal-center should be tuned right;

if the beam map is right-uncentered, then the horizontal-center should be tuned left;

if the beam map has an underscanned Y-direction scan range, then a vertical-magnitude should be adjusted;

if the beam map has an overscanned Y-direction scan range, then the vertical-magnitude should be adjusted; and if the beam map has an uncentered Y-direction scanning center, then a vertical-center should be adjusted.

11. An ion implantation system with an automatic supervision system for controlling implantation of ions in a semiconductor wafer, the ion implantation system being configured to generate a beam map during ion implantation, said beam map comprising a plurality of frames each having an outmost edge and one or more minors, said outmost edge and said minors each having a width, wherein the width of said outmost edge is larger than the width of said minor, the ion implantation system comprising:

an implanter configured to implant ions in the semiconductor wafer by repeated scanning of a beam of ions across the wafer;

a feature extractor coupled to the implanter, wherein the feature extractor is configured to extract information from the beam map generated by the ion implantation system, wherein said feature extractor comprises;

(a) a visual signal converter coupled to said implanter, said visual signal converter being configured to extract features of the outmost edge and the minors;

(b) a data converter coupled to said visual signal converter, said data converter being configured to generate mean, variance and combinations thereof from the features of the outmost edge and the minors; and (c) data examiner coupled to the implanter, wherein the data examiner is configured to separate information corresponding to the outmost edge from information corresponding to the minors, wherein for each frame of said beam map said information extracted by said feature extractor comprises magnitudes of:

a first left segment spanning from a beginning point of said outmost edge to a first point at which said outmost edge equals a predetermined threshold;

a first center segment spanning from said first point to a second point at which said outmost edge equals the predetermined threshold;

a first right segment spanning from the second point to an ending point of said outmost edge;

a second left segment spanning from a beginning point of a minor to a third point at which said minor equals the predetermined threshold;

a second center segment spanning from the third point to a fourth point at which said minor equals the predetermined threshold; and a second right segment spanning from the fourth point to an ending point of said minor;

a fuzzification subsystem coupled to the feature extractor, wherein the fuzzification subsystem is configured to determine a confidence level of the information extracted by said feature extractor; and an expert subsystem coupled to the fuzzification subsystem, wherein the expert subsystem is configured to receive the information from said feature extractor and the determined confidence level and in response thereto recognize abnormal ion beam scanning and provide adjustment information for adjusting the implanter to correct the abnormal ion beam scanning, wherein said expert subsystem comprises:

(a) an inference engine coupled to said data examining means, said inference engine being configured to provide a model for recognizing symptoms of abnormal scanning; and (b) a rule base coupled to said inference engine, said rule base being configured to provide a set of rules for adjusting said implantation means to correct the abnormal beam scanning.

12. The ion implantation system according to claim 11, wherein said expert subsystem is further configured automatically adjust implantation of the implanter.

13. The ion implantation system according to claim 11, wherein said data examiner uses a Chebyshev method to separate the information corresponding to the outmost edge from the information corresponding to the minors.

14. The ion implantation system according to claim 11, wherein said fuzzification subsystem uses a bidirectional fuzzy rule.

15. The ion implantation system according to claim 11, wherein said data converter provides information comprising:

a first value representing an average duty of ion implantation on the wafer during a beam scanning path;

a second value representing variation of the beam map from center of a beam monitor;

a third value representing symmetry of the outmost edge of the beam map; and a fourth value representing symmetry of the minor of the beam map.

16. The ion implantation system according to claim 15, wherein:

the first value is dependent on a mean value of the first center segment;

the second value is dependent a difference of a mean value of the first left segment and a mean value of the first right segment;

the third value is dependent on a sum of a variance of the first left segment and a variance of the first right segment; and the fourth value is dependent on a sum of a variance of the second left segment and a variance of the second right segment.

17. The ion implantation system according to claim 16, wherein said model of the inference engine comprises:

a width of a beam map, wherein the width of the beam map is appropriate if the first value is larger than a first boundary and less than a second boundary, narrow if the first value is less than the first boundary and wide if the first value is larger than the second boundary;

a centering of the beam map, wherein the beam map is centered if the second value is zero, left-uncentered to left if the second value is negative, and right-uncentered if the second value is positive;

a symmetry of the beam map, wherein the symmetry of the beam map is symmetric if the third value is less than a third boundary, and asymmetric if the third value is larger than the third boundary; and a symmetry of minors of the beam map, wherein the symmetry of minors is symmetric if the fourth value is less than a fourth boundary, and asymmetric if the fourth value is larger than the fourth boundary.

18. The ion implantation system according to claim 17, wherein said set of rules of the rule base comprises:

if the beam map is underscanning, then a horizontal-magnitude should be tuned up;

if the beam map is overscanning, then the horizontal-magnitude should be tuned down;

if the beam map is left-uncentered, then a horizontal-center should be tuned right;

if the beam map is right-uncentered, then the horizontal-center should be tuned left;

if the beam map has an underscanned Y-direction scan range, then a vertical-magnitude should be adjusted;

if the beam map has an overscanned Y-direction scan range, then the vertical-magnitude should be adjusted; and if the beam map has an uncentered Y-direction scanning center, then a vertical-center should be adjusted.

* * * * *